US008534347B2

(12) United States Patent
Denny et al.

(10) Patent No.: US 8,534,347 B2
(45) Date of Patent: Sep. 17, 2013

(54) EXPANDABLE FLUID COOLING STRUCTURE

(75) Inventors: Ronald R. Denny, Brooklyn Center, MN (US); Bobby Jim Kowalski, Vadnais Heights, MN (US); James T. Seward, Edina, MN (US); Michael P. Ebsen, Bloomington, MN (US); Thomas Rosenthal, St. Paul, MN (US); William J. Leinberger, Woodbury, MN (US); Jeffery Stagg Young, St. Paul, MN (US); Andrew D. Josephson, Plymouth, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 346 days.

(21) Appl. No.: 12/926,085

(22) Filed: Oct. 25, 2010

(65) Prior Publication Data

US 2011/0168375 A1 Jul. 14, 2011

Related U.S. Application Data

(63) Continuation of application No. 12/230,422, filed on Aug. 28, 2008, now Pat. No. 7,819,667.

(60) Provisional application No. 60/935,717, filed on Aug. 28, 2007, provisional application No. 60/960,772, filed on Oct. 12, 2007.

(51) Int. Cl.
*F28F 7/00* (2006.01)
*H05K 7/20* (2006.01)

(52) U.S. Cl.
USPC ............... 165/80.4; 165/147; 165/46; 165/83

(58) Field of Classification Search
USPC ............... 165/80.4, 104.33, 147, 148, 46, 83, 165/84; 361/699, 702, 716, 721; 257/714
See application file for complete search history.

(56) References Cited

U.S. PATENT DOCUMENTS

| | | | | |
|---|---|---|---|---|
| 2,254,406 | A * | 9/1941 | Zarotschenzeff | 62/341 |
| 4,109,707 | A * | 8/1978 | Wilson et al. | 165/46 |
| 4,120,021 | A * | 10/1978 | Roush | 361/711 |
| 4,938,279 | A * | 7/1990 | Betker | 165/46 |
| 5,205,348 | A * | 4/1993 | Tousignant et al. | 165/46 |
| 5,289,694 | A * | 3/1994 | Nordin | 62/259.2 |
| 5,485,671 | A * | 1/1996 | Larson et al. | 29/890.032 |
| 6,665,184 | B2 * | 12/2003 | Akselband | 361/699 |
| 6,690,578 | B2 * | 2/2004 | Edelmann | 361/699 |
| 2004/0074630 | A1 * | 4/2004 | Sen et al. | 165/46 |

* cited by examiner

*Primary Examiner* — Tho V Duong
(74) *Attorney, Agent, or Firm* — Ingrassia Fisher & Lorenz, P.C.

(57) ABSTRACT

A connector system is provided. The system includes a substantially circular interconnecting hub, and a plurality of circuit board bays configured substantially radially around the substantially circular interconnecting hub. Each circuit board bay has a plurality of aligned connectors configured to receive a circuit board. The interconnecting circuit hub has, for each individual circuit board bay, a direct data pathway connecting the individual circuit board bay to all remaining circuit board bays of the plurality of circuit board bays. Each of the plurality of circuit board bays can directly communicate through the interconnecting hub with each of the remaining circuit boards bays.

24 Claims, 40 Drawing Sheets

To Fig. 8D 2714
2706
2704
2714
2700
2702
2712
2710

2902
Fig. 29B
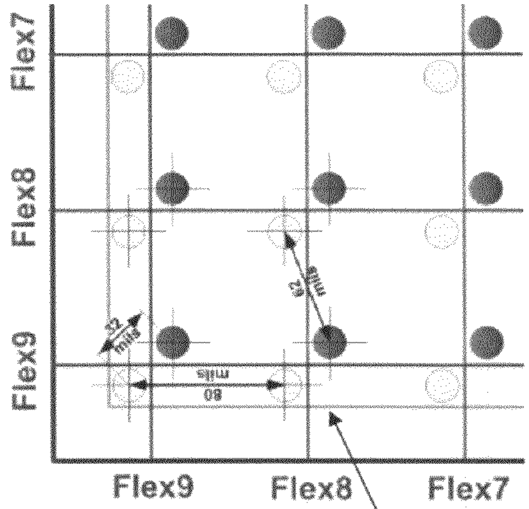
2902
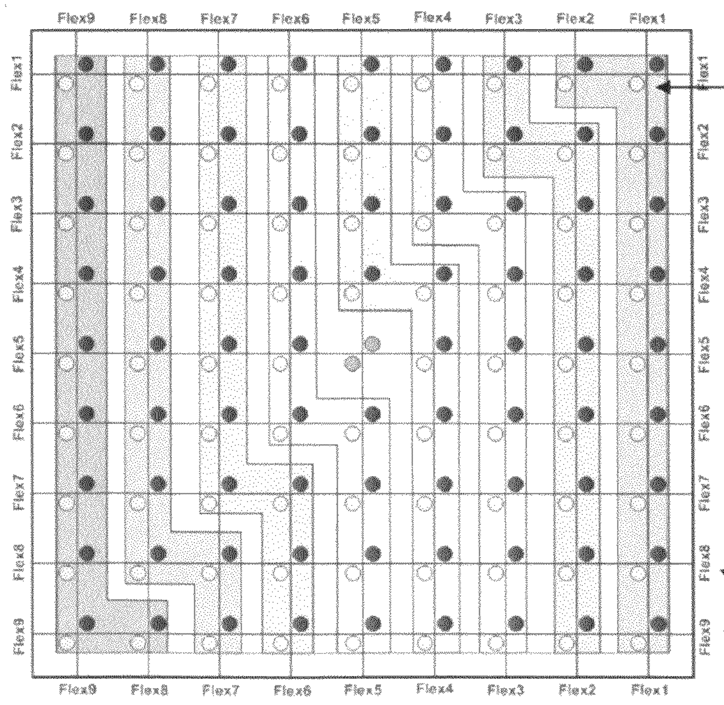
Fig. 29A
2904

EXPANDABLE FLUID COOLING STRUCTURE

CROSS REFERENCE TO RELATED APPLICATIONS

The instant application is a continuation of, and claims priority to, U.S. patent application Ser. No. 12/230,422, filed Aug. 28, 2008, which in turn is a utility filing that claims priority to U.S. Provisional Patent Applications 60/935,717 filed Aug. 28, 2007 and 60/960,772 filed Oct. 12, 2007, the disclosures of which are incorporated herein in their entireties.

BACKGROUND OF THE INVENTION

1. Field of the Invention

The present invention relates to a multi-dimensional connector for connecting circuit boards. More specifically, the present invention relates to a multi-dimensional interface for connecting circuit boards.

2. Discussion of Background Information

The use of circuit boards is well known in the data processing industry. Multiple circuit boards need to be connected together to allow the signals to pass from one to the other. A popular type of interconnection between circuit boards known as an orthogonal packaging system is described in U.S. Pat. No. 4,708,660, which is incorporated by reference herein in its entirety. In this system, a set of circuit boards are stacked in one alignment, while another set of boards are stacked in a perpendicular (i.e., orthogonal) alignment. Each board is provided with several bowtie connectors in which the connectors are identical and can connect together orthogonally. The stacks of circuit boards are then pressed into each other to form a matrix of connections, in which every board connects to every other board. The configuration provides a connection from each circuit board to every perpendicular circuit board.

A drawback of the prior art orthogonal package is that the number of boards is limited by mechanical and space considerations. Current boards can only be manufactured to a maximum of 34 inches, with a maximum of 34 bowtie connectors. Thus, currently only a maximum of 68 boards can be configured in the manner shown in the prior art. If a $69^{th}$ board is needed, it will be distinct form the orthogonal matrix and have to interface via a separate connector.

Due to these limitations, it is often necessary to create banks of orthogonal connectors which occupy considerable floor space. For example, IBM BlueGene/L maintains a facility in Livermore in which the banks require 64 cabinets spread over 2,500 sq ft of floor space to provide 32 TB memory at 1.2 TB/s bisection. A Cray Red Storm system requires 175 cabinets over 3,500 sq ft of floor space to provide 75.9 TB memory at 10 TB/s bisection.

Another drawback of the prior art is that circuit boards have direct connections only with the perpendicular circuit boards. There is no direct connection with parallel circuit boards in the same stack. The only way that a circuit board can communicate with other circuit boards in the same stack is by routing the communication through a circuit board in the orthogonal stack, which reduces the overall operating speed of the system.

SUMMARY OF THE INVENTION

According to an embodiment of the invention, a connector system is provided. The system includes a substantially circular interconnecting hub, and a plurality of circuit board bays configured substantially radially around the substantially circular interconnecting hub. Each circuit board bay has a plurality of aligned connectors configured to receive a circuit board. The interconnecting circuit hub has, for each individual circuit board bay, a direct data pathway connecting the individual circuit board bay to all remaining circuit board bays of the plurality of circuit board bays. Each of the plurality of circuit board bays can directly communicate through the interconnecting hub with each of the remaining circuit boards bays.

The above embodiment may have various optional features. The number of the plurality of circuit boards bays may be an odd number, and the interconnecting circuit hub may have, for each individual circuit board bay, a direct data pathway connecting each individual circuit board to itself. The plurality of aligned connectors may be aligned in parallel with an axis of the interconnecting hub. The axis of the interconnecting hub may extend vertically, the plurality of connectors may extend vertically, and a circuit board connected to the plurality of connectors may lie in a vertical plane. At least some of the plurality of circuit board bays may have a circuit board mounted therein. The interconnecting hub may include a plurality of substantially circular components stacked concentrically on an axis of the interconnecting hub, and each of the plurality of substantially circular components may provide a single communications pathway between each circuit board bay and one of the plurality of circuit board bays. Each of the plurality of substantially circular components may provide a single communications pathway between one of the plurality of circuit board bays and the one of the plurality of circuit board bays.

A fluid coolant storage container may be located beneath the interconnecting hub. A support structure may at least partially surrounding the interconnecting hub, configured to support circuit boards connected to the plurality of circuit board bays, a plurality of fluid heat sinks interspersed within the support structure interspersed between spaces configured to receive circuit boards, such that the fluid coolant storage container may be in fluid communication with the plurality of fluid heat sinks. Each fluid heat sink may be substantially wedge shaped. The fluid heat sinks may expand in the presence of positive fluid pressure, and contract in the presence of negative fluid pressure, such that a fluid heat sink in an expanded state may come into contact with any adjacent circuit board.

According to another embodiment of the invention, a connector system is provided. The connector system includes a circular interconnecting hub, a plurality of circuit board bays configured radially around the substantially circular interconnecting hub, each circuit board bay having a plurality of aligned connectors configured to receive a circuit board, the interconnecting circuit hub having, for each individual circuit board bay, a direct data pathway connecting the individual circuit board bay to all remaining circuit board bays of the plurality of circuit board bays, such that each of the plurality of circuit board bays can directly communicate through the interconnecting hub with each of the remaining circuit boards bays.

The above embodiment may have various optional features. The number of the plurality of circuit boards bays may be an odd number, and the interconnecting circuit hub may have, for each individual circuit board bay, a direct data pathway connecting each individual circuit board to itself. The plurality of aligned connectors may be aligned in parallel with an axis of the interconnecting hub. The axis of the interconnecting hub may extend vertically, the plurality of connectors may extend vertically, and a circuit board connected to the plurality of connectors may lie in a vertical plane. At least some of the plurality of circuit board bays may have a circuit board mounted therein. The interconnecting hub may include a plurality of substantially circular components stacked concentrically on an axis of the interconnecting hub, and each of the plurality of substantially circular components may provide a single communications pathway between each circuit board bay and one of the plurality of circuit board bays. Each of the plurality of substantially circular components may provide a single communications pathway between one of the plurality of circuit board bays and the one of the plurality of circuit board bays.

A fluid coolant storage container may be located beneath the interconnecting hub. A support structure may at least partially surrounding the interconnecting hub, configured to support circuit boards connected to the plurality of circuit board bays, a plurality of fluid heat sinks interspersed within the support structure interspersed between spaces configured to receive circuit boards, such that the fluid coolant storage container may be in fluid communication with the plurality of fluid heat sinks. Each fluid heat sink may be substantially wedge shaped. The fluid heat sinks may expand in the presence of positive fluid pressure, and contract in the presence of negative fluid pressure, such that a fluid heat sink in an expanded state may come into contact with any adjacent circuit board.

According to yet another embodiment of the invention, a connector system is provided. The system includes, a circular interconnecting hub having a central axis, a plurality of circuit board bays configured radially around the substantially circular interconnecting hub, each bay having a plurality of connectors aligned with the central axis, a plurality of circuit boards, each inserted into and one of the circuit board bays, the interconnecting circuit hub providing a direct data pathway from each of the plurality of circuit boards to all of the plurality of circuit boards, such that wherein every circuit board connected to the plurality of bays can communicate with itself and all remaining ones of the plurality of circuit boards without having to pass the communication through any other of the plurality of circuit boards.

The above embodiment may have various features. The number of the plurality of circuit board bays may be an odd number. The plurality of circuit boards may be aligned in parallel with an axis of the interconnecting hub. The interconnecting hub may include a plurality of circular components stacked concentrically on an axis of the interconnecting hub, and each of the plurality of circular components may provide a single communications pathway between each circuit board and one of the plurality of circuit boards. Each of the plurality of circular components may provide a single communications pathway between one of the plurality of circuit boards and the one of the plurality of circuit boards.

The above embodiment may include a fluid coolant storage container located beneath the interconnecting hub, a wedge shaped support structure at least partially surrounding the interconnecting hub, configured to support the plurality of circuit boards connected to the plurality of circuit board bays, a plurality of fluid heat sinks interspersed between the plurality of circuit boards, and the fluid coolant storage container being in fluid communication with the plurality of fluid heat sinks. Each fluid heat sink may be substantially wedge shaped.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein:

FIGS. 29A and 29B illustrate a header of a connector according to an embodiment of the invention.

DETAILED DESCRIPTION OF EXEMPLARY EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
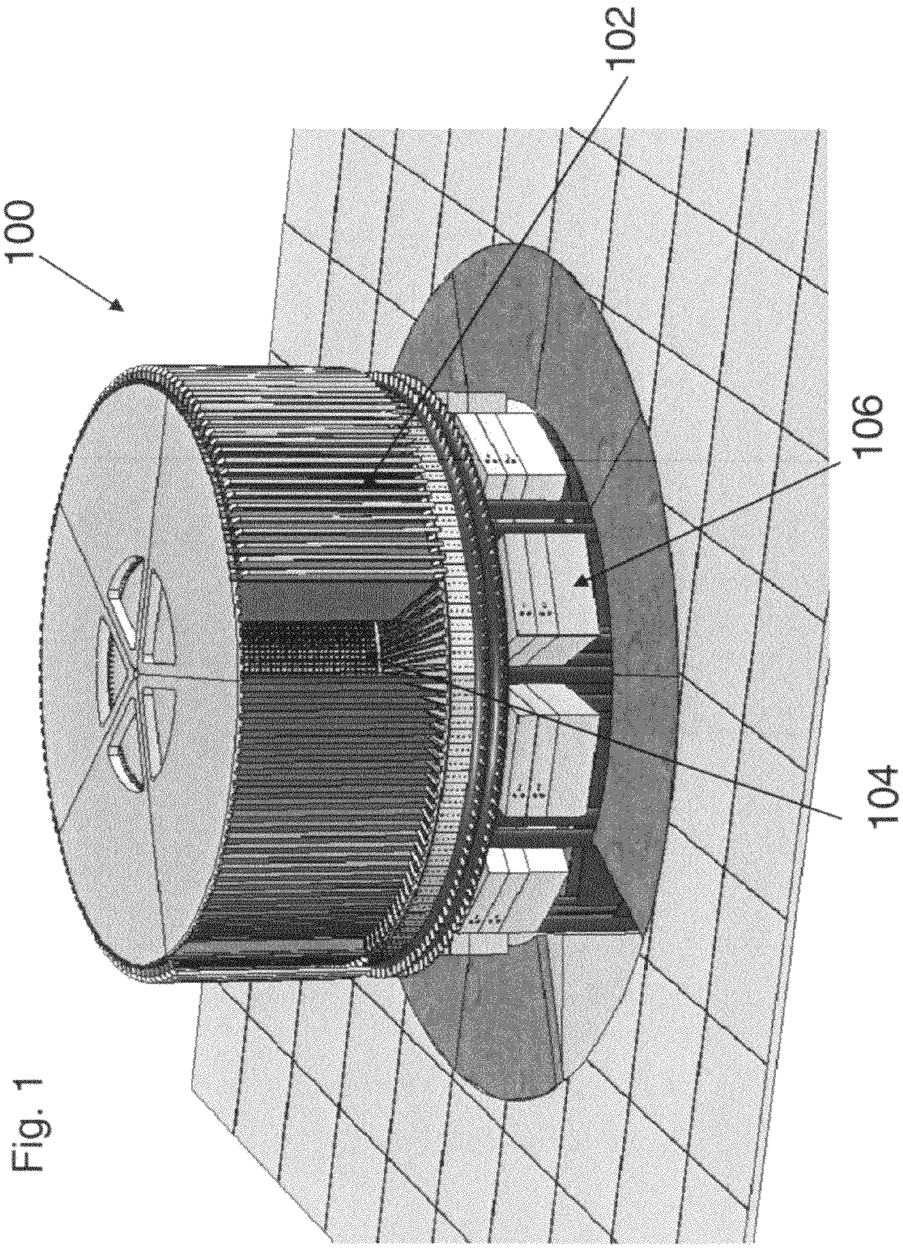
FIG. 1 illustrates an embodiment of a carousel according to the invention.

Referring now to FIG. 1, an embodiment of a carousel 100 is shown. Carousel 100 is cylindrical in shape, but other shapes could be used. Carousel 100 connects to several vertical circuit boards 102 aligned radially around a central hub 104. Coolant containers 106 mounted below central hub 104 provide coolant to interspaced heat sinks 110 (not shown in FIG. 1) to cool the circuit boards 102.

Figure 2:
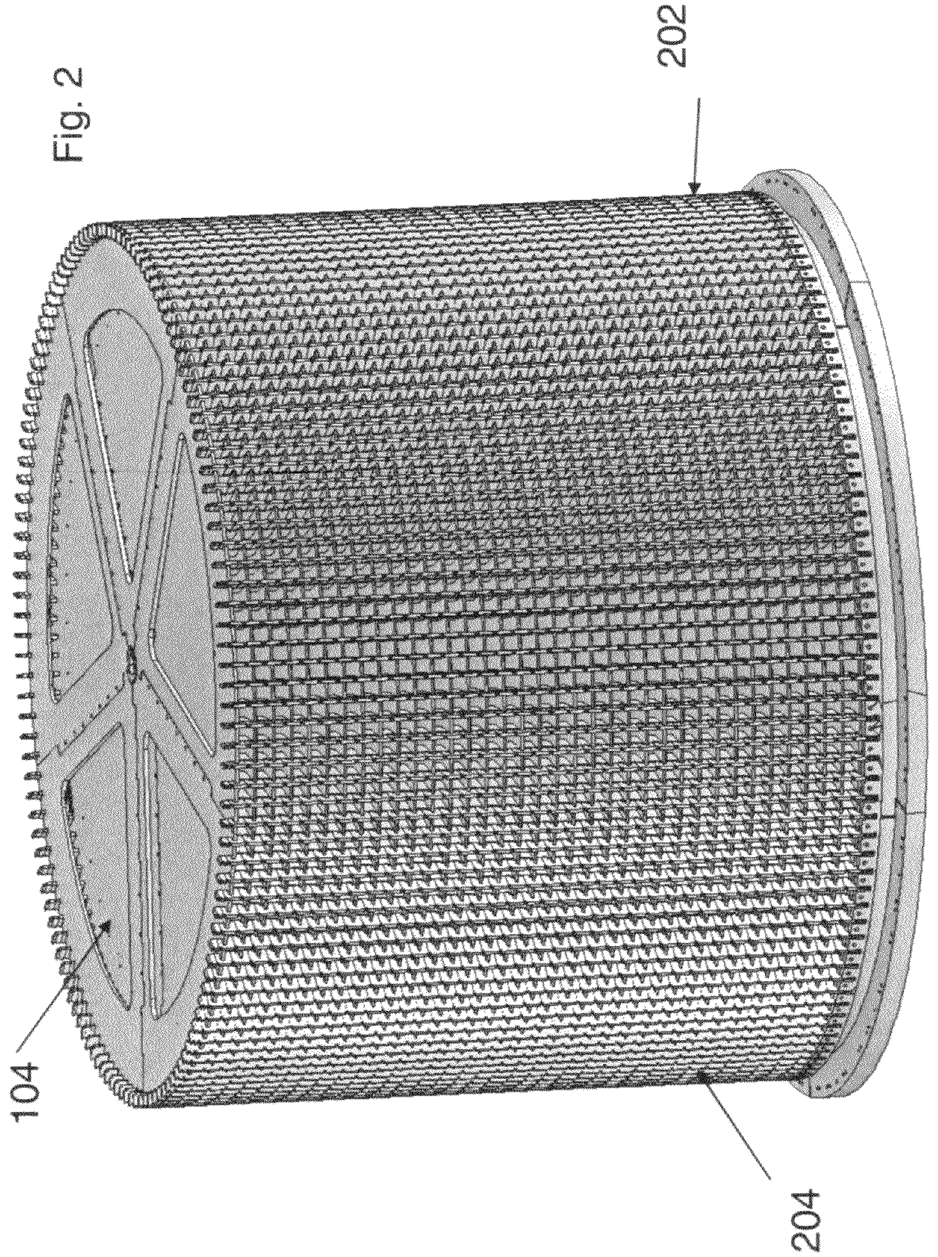
FIG. 2 is a perspective view of a central hub of a carousel.
Figure 3:
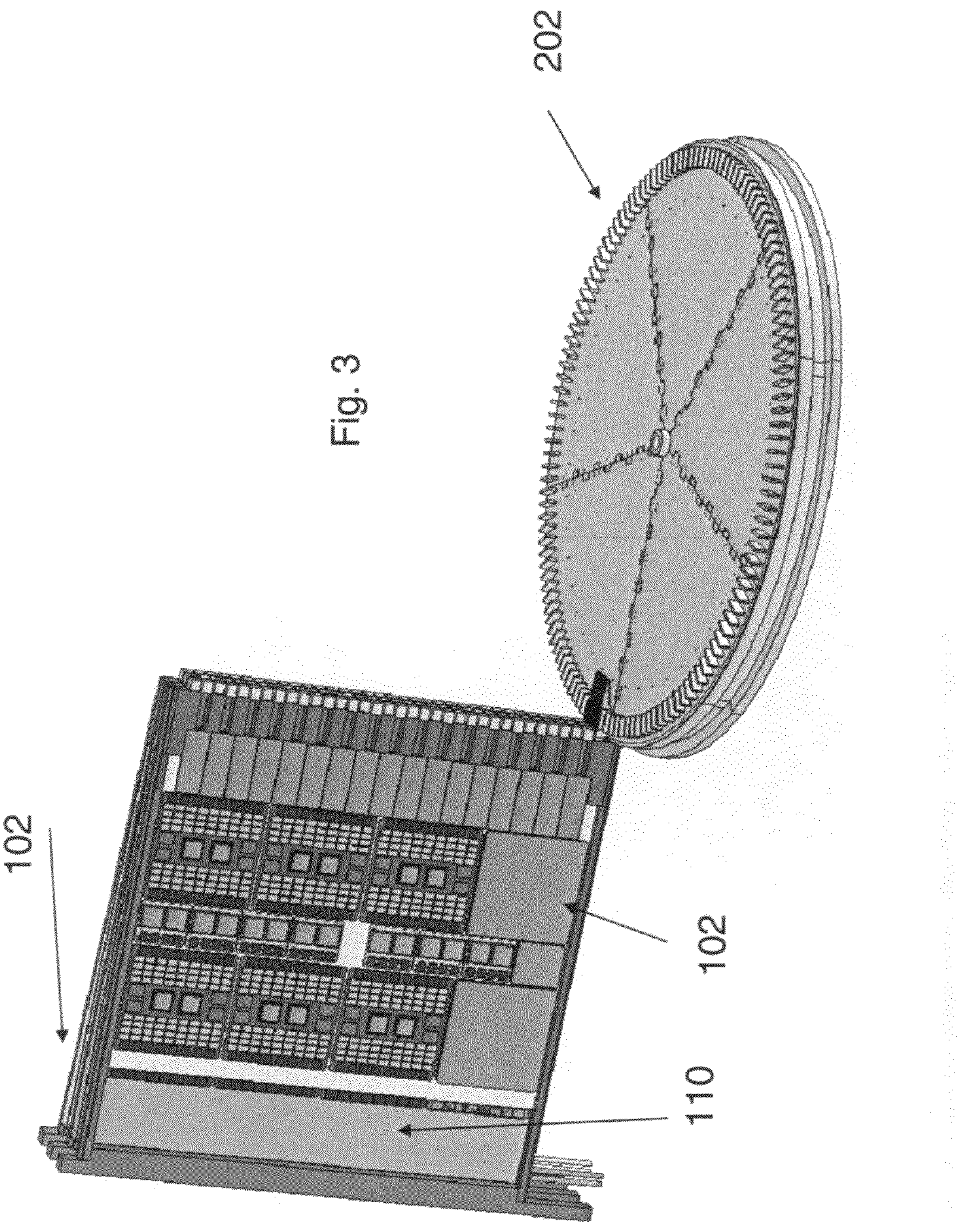
FIG. 3 is a perspective view of circuit boards connecting to a lower plate in a central hub.

Referring now to FIGS. 2 and 3, central hub 104 includes a plurality of plates 202 coaxially aligned. Each plate 202 has around its circumference a plurality of connectors 204 that connects to the individual circuit boards 102. The number of connectors 204 on a single plate preferably corresponds to the maximum number of boards 102 that the hub 104 can receive, although some connectors 204 may be reserved for other uses; individual connectors may also be allocated to several plates 202 in the stack. FIG. 3 illustrates the connection between a plate 202 and adjacent vertical circuit boards 102 with an optional heat sink 110 there between. Circuit boards 102 would similarly connect with additionally stacked plates 202. As seen in FIG. 2, the connectors 204 of hub 104 form individual columns. Each column of connectors defines a slot or bay for receiving a circuit board 102, or potentially through other intervening connector structures.

Central hub 104 provides direct interconnection between each of the boards 102 through the individual plates 202. By proper orientation of plates 202 and/or layout of each plate, each board 102 will have an individual direct pathway to every other board 102, including itself. "Direct" in this context refers to a pathway that allows two of circuit boards 102 to communicate without having to pass through any other circuit boards 102.

Figures 4A, 4B:
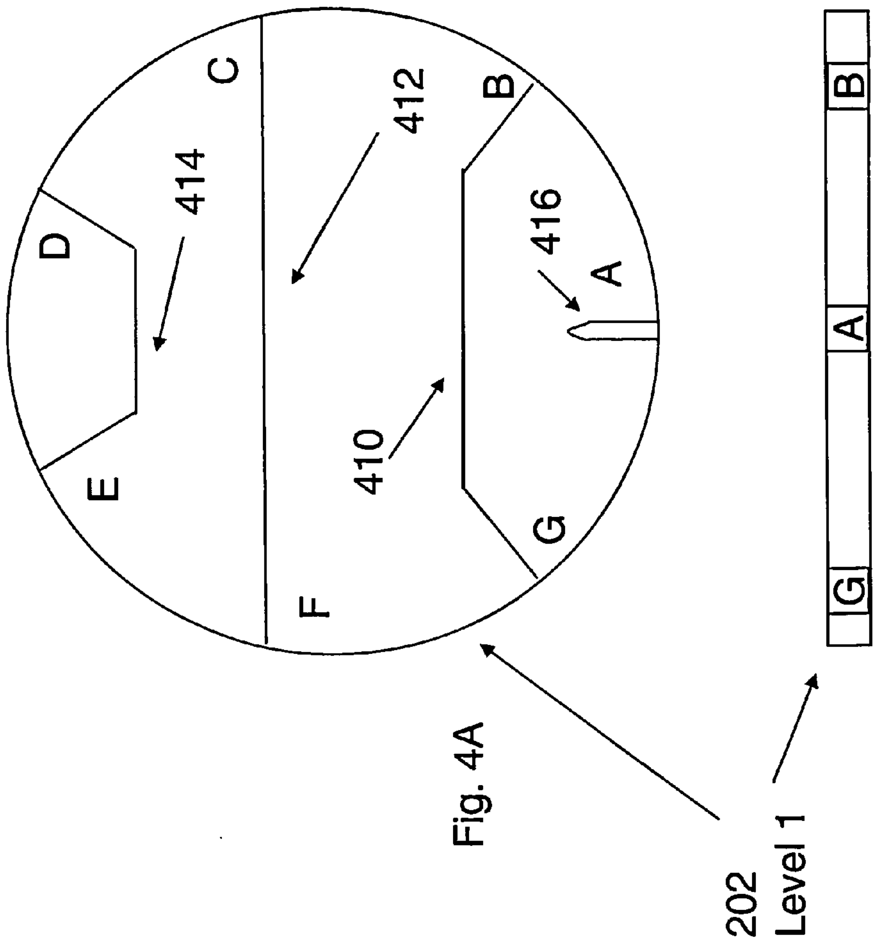
FIGS. 4A-4C show a non-limiting example of signal pathways within a plate of a central hub.

By way of a non-limiting example, consider a central hub which is designed to connect to seven (7) different circuit boards 102, such that it has seven columns of connectors. FIG. 4A shows a lowest level (level 1) plate 202 configured to connect with seven (7) circuit boards 102 via the peripheral interfaces labeled A-G. The peripheral interface A is wired via pathway 416 to connect to itself. Each of the other remaining peripheral interfaces have pathways 410, 412 and 414 to form connection with other circuit boards 102. Specifically, communications pathways 410, 412 and 414 connect to peripheral interface B-G, C-F, and D-E, respectively. FIG. 4B shows a side view of the lower level plate 202 that form the base of the columns of central hub 104.

Figure 4C:
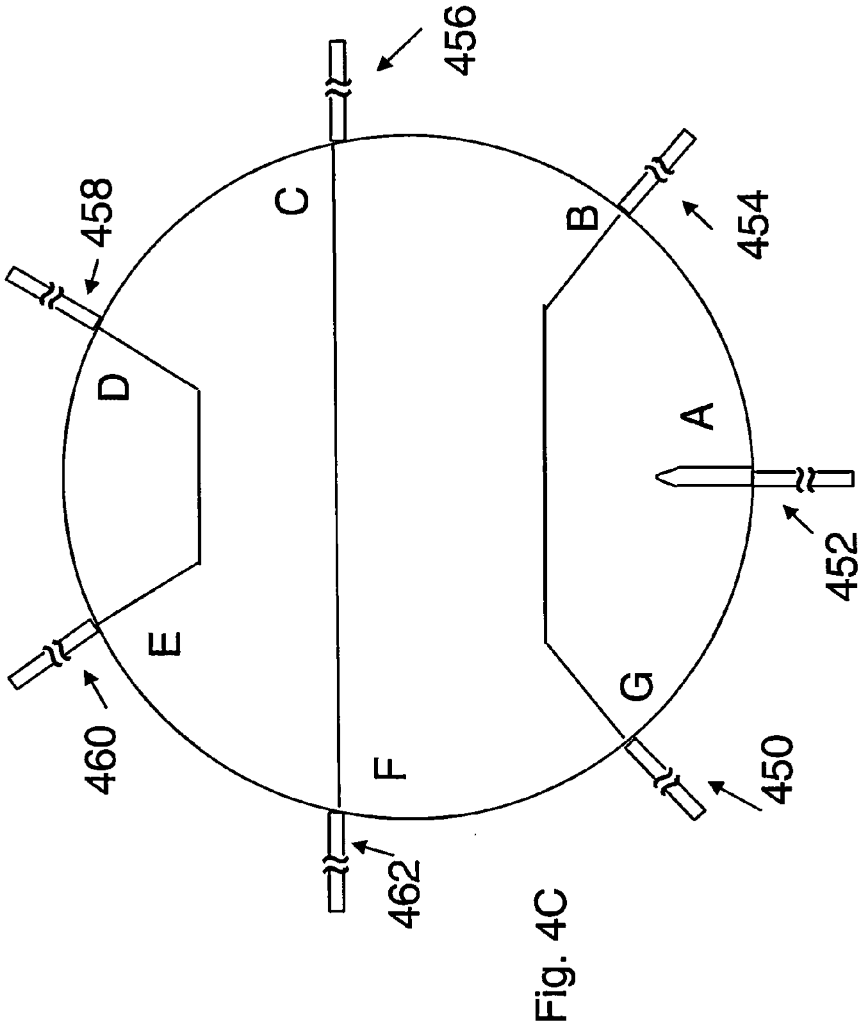

Individual circuit boards 102 connected into the plate 202 via connectors 204 will thus be able to communicate with each other based upon the established pathways. For example, FIG. 4C shows the plate 202 of FIG. 4A with seven (7) connected circuit boards 102 individually labeled 450, 452, 454, 456, 458, 460, and 462. Circuit board 450 connects to circuit board 454 via the B-G pathway. Similarly, circuit boards 458 and 460 connect via D-E, and circuit boards 456 and 462 via C-F. Circuit board 452 connects to itself via pathway A. A single plate 202 can thus connect each circuit board 102 with one other circuit board 102 (including one connecting to itself).

Although each pathway is shown in the noted figures as a single line, preferably the pathway includes several individual communications paths (e.g., wires or fiber optics) that ultimately connect to the individual pins of connector 204. Based on current commercial connectors, such communication paths would be typical for a single pathway between circuit boards 102. The number of pathways exemplarily depicted herein is illustrative only and does not limit the scope of the invention or any individual claim unless expressly recited in that claim. Separate portions of each signal pathway may be devoted to signal transmission and receipt, such that the board(s) 102 can communicate bidirectionally through plate 202.

Figure 5A:
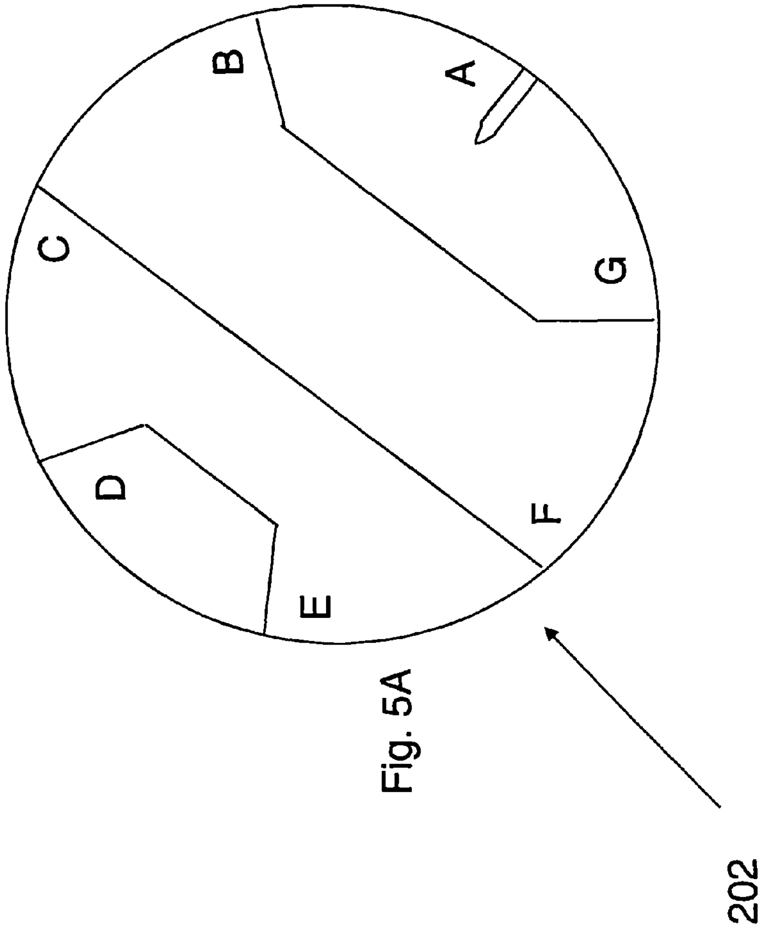
FIGS. 5A-5C show a non-limiting example of a second plate stacked and oriented with respect to the plate in FIGS. 4A-4B.
Figure 5B:
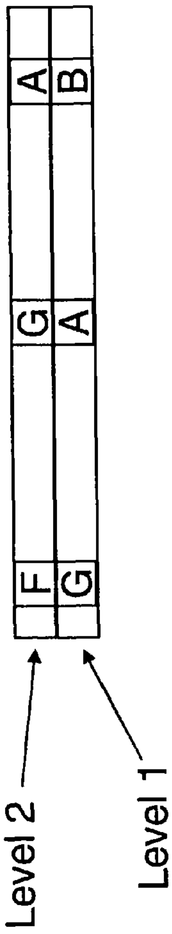
Figure 5C:
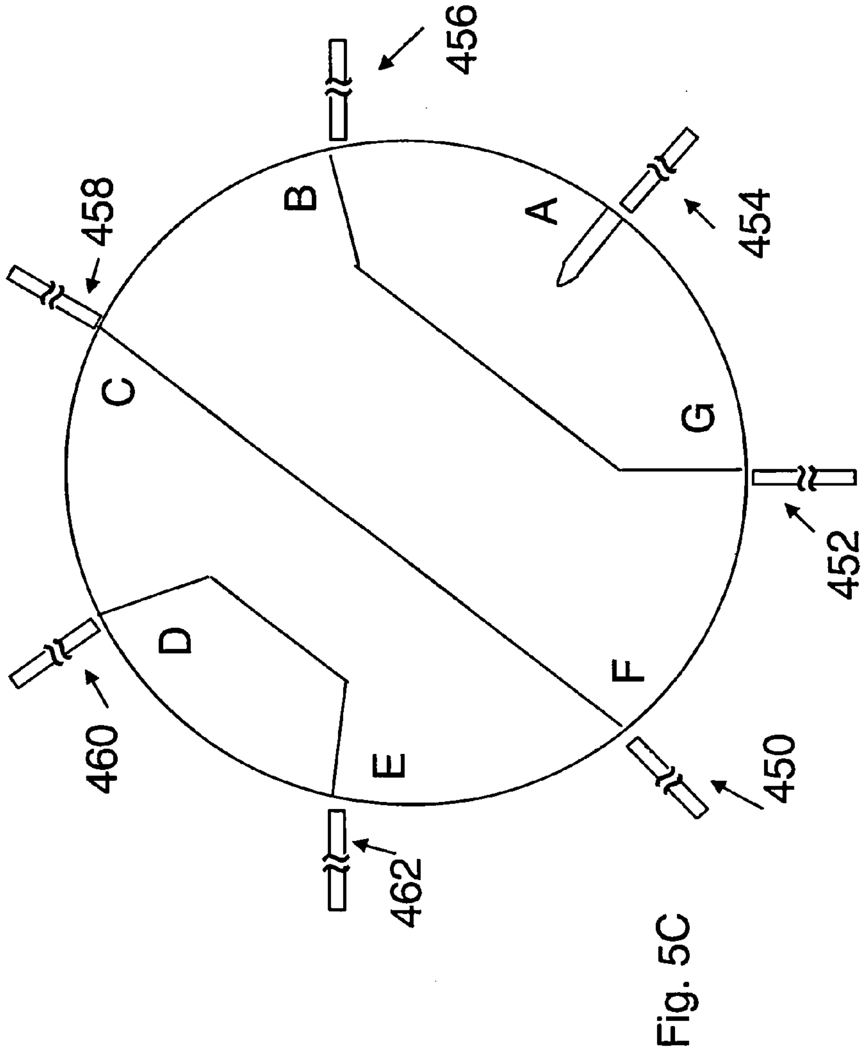
Figure 6C:
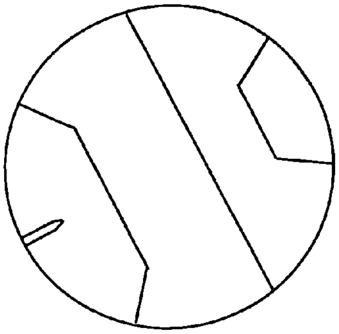
FIGS. 6A-6E show a non-limiting example of third-seventh plates stacked and oriented with respect to the plates in FIGS. 5A-5B.

A preferred aspect of the exemplary embodiment of the present invention is for each circuit board 102 to connect to all of the other circuit boards 102. Additional plates 202 are utilized. Referring now to FIG. 5A, the next higher plate 202 in the stack of central hub 104 is the same as in the lower level, except that it is rotated clockwise by the width of one connector 204. FIG. 5B presents a side view which shows the orientation of the two plates 202. FIG. 5C shows the plates 202 of FIG. 5B with the connected circuit boards 102.

Even though each plate 202 in this embodiment has an identical pathway layout, the rotational change in alignment creates an entirely different set of connections between circuit boards 102. For example, in level 1 plate 202 ("lower plate") circuit board 452 connected to itself via the A pathway, but the level 2 plate 202 ("second plate") connects board 452 to board 456 via the B-G pathway. Similarly, lower plate 202 connected circuit board 458 to circuit board 460 via D-E pathway, but the second plate 202 connects board 458 to board 450 via the C-F pathway. The two plates 202 in FIGS. 5A-5C will thus collectively provide a connection from each board 102 to two (2) circuit boards 102 around the periphery.

Figure 7:
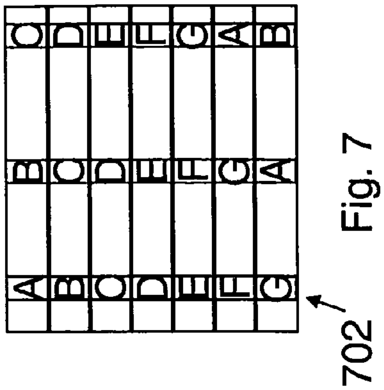
FIG. 7 shows a side view of the plates stacked from FIGS. 4A, 5A, and 6A-6E.
Figure 6B:
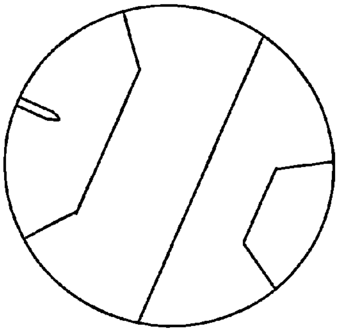
Figure 6E:
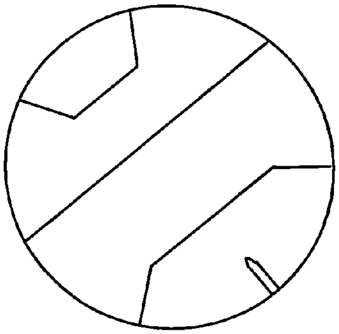
Figure 6A:
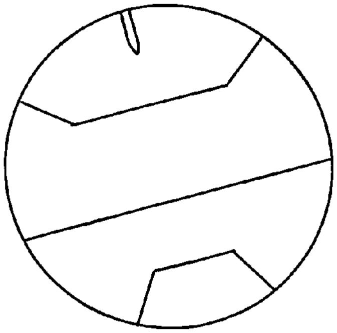
Figure 6D:
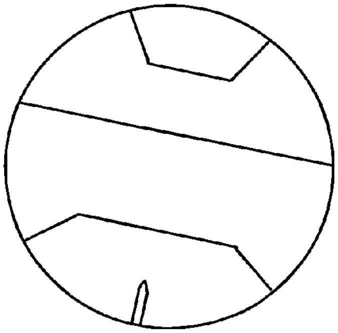
Figure 8A:
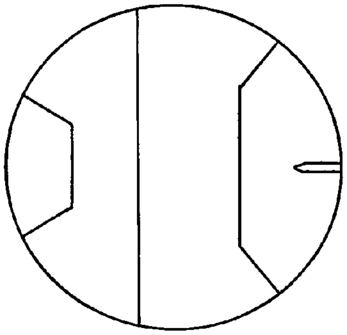
FIGS. 8A-8G show another embodiment of plate orientation of seven plates to form a central hub.
Figure 8B:
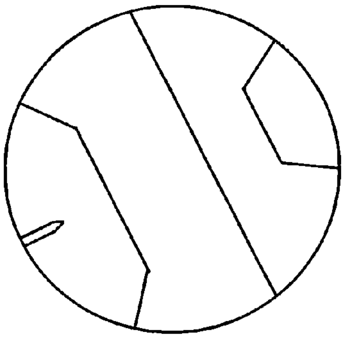
Figure 8C:
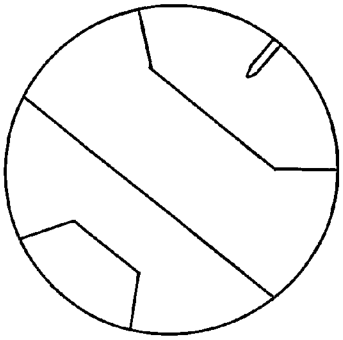

The remaining layering of the stack of plates 202 for this example is shown in FIGS. 6A-6E, in which each of the subsequent level plates 202 is at a different orientation relative to the other plates 202 in central hub 104. Once seven (7) plates are configured (one for each board 450-462), then the stack of plates 202 form central hub 104. Every board 102 will have a direct connection to every other board through one of the plates 202. Referring to the side view in FIG. 7, this can be seen in that each column of connectors 204 has at least one of the connecting letters A-G.

In the above discussion, by virtue of the sequential rotation of each plate 202, no two plates 202 are in the same alignment: this provides at least one connection between each and every circuit board 102, including one connection of each circuit board 102 to itself. In other words, hub 104 provides every column of connectors 204 at least one pathway to every other circuit board bay, including itself. Any orientation of plates 202 that accomplishes this, either with or without duplicative pathways, is within the scope of the exemplary embodiments of the invention.

Figure 9:
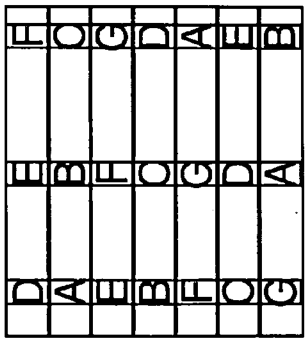
FIG. 9 shows a side view of the central hub based on the plate orientation of FIGS. 8A-8G.
Figures 8D, 8E, 8F, 8G:
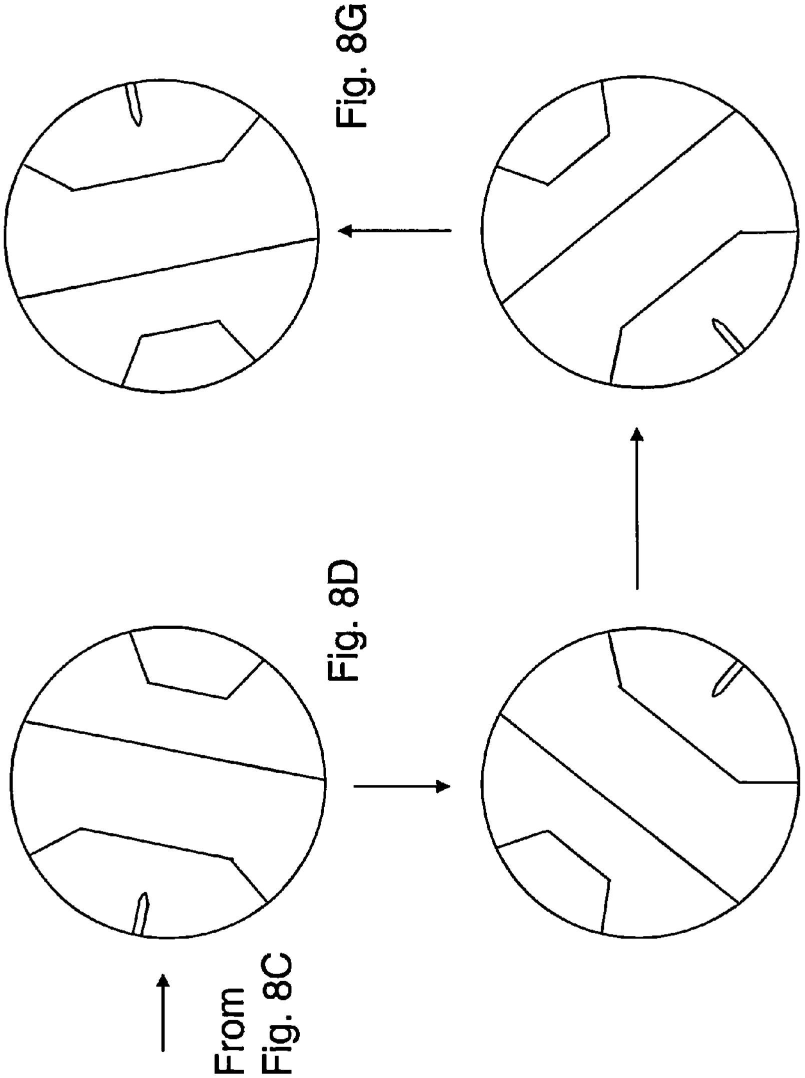

The rotation example described above, is essentially a sequential connection to every other board. By way of example, board 452 will initially connect to itself via the A pathway, and then have the following pattern of connections; 456-460-450-454-458-462. To provide a simpler sequence, two patterns of plates 202 can be interleaved. The odd level plates 202 (first, third, fifth, etc., from the bottom) are each offset from each other by one connector rotation in a clockwise direction. The even level plates 202 (second, fourth, sixth, etc., from the bottom) are also offset from each other by one connector rotation. However, the first and second plates 202 are offset by approximately 180 degrees+½ of a connector 204 rotation. FIGS. 8A-8G show the orientation of plates 202 stacked in this alignment, and FIG. 9 shows the side view of the connections. The resulting configuration of plates 202 are less organized than in the prior embodiment (compare FIG. 9 and FIG. 7), but the circuit boards 102 will connect in sequence which is easier to follow: 452-454-456-458-460-462-450. Thus circuit board 452 connects to itself on the first level plate 202, circuit board 454 on the second level plate 202, circuit 456 at the next level, etc.

Figure 10:
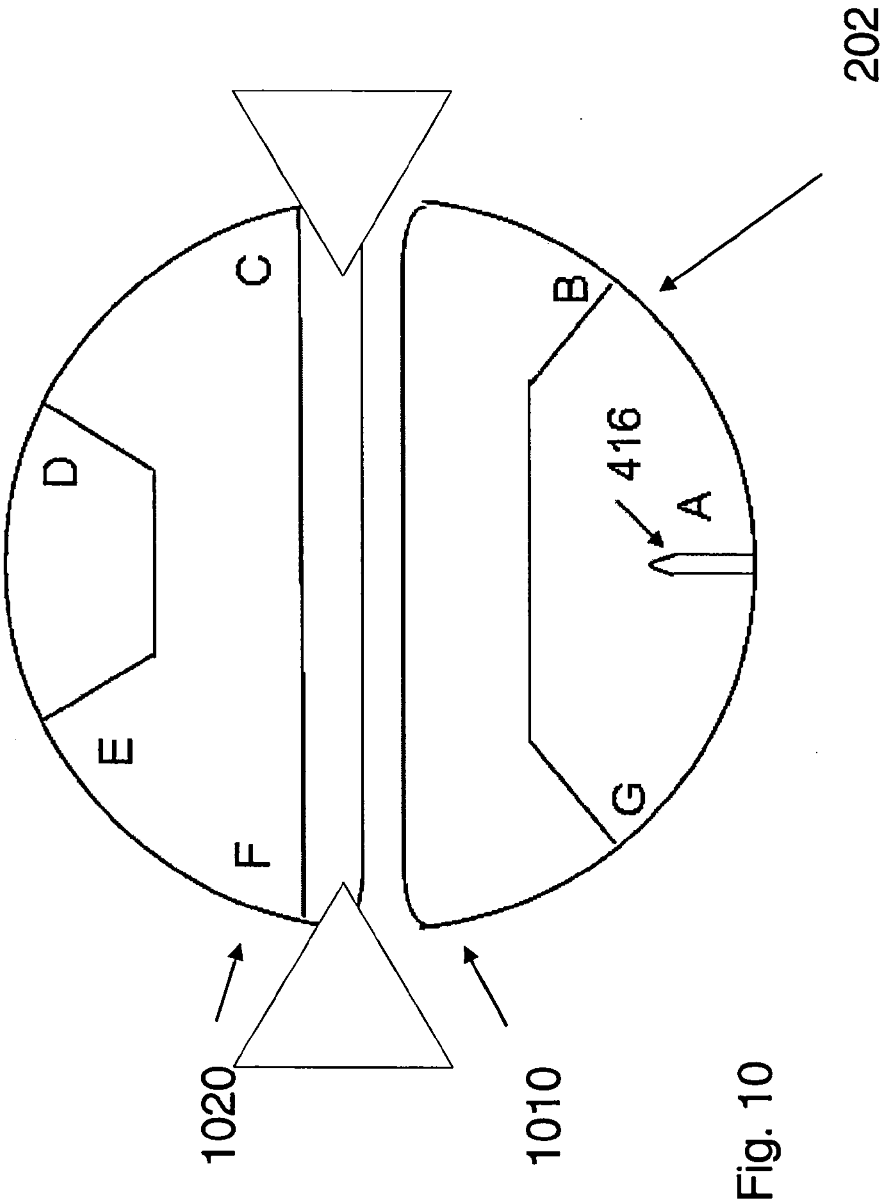
FIG. 10 shows an embodiment of component parts that make up a plate of a central hub.

Plates 202 may be constructed as a unitary component, or as separate components that may or may not be attached. The various figures discussed above show plate 202 as a unitary member. FIG. 10 exemplarily depicts a plate 202 that is made of two separate sections 1010 and 1020 that are not in direct contact with each other. In FIG. 10, each of sections 1010 and 1020 are self contained, in that no communication pathways cross between them. However, in another embodiment, communication pathways could cross with the provision of appropriate connectors.

Individual plates 202 may be identical in both pathway layout and structure. In the alternative, the pathway layouts are all identical, but the sizes of the plates 202 may be different such as in FIGS. 12-15. The size and layout may also be different, potentially custom made for each level. Plates 202 may also be grouped together for ease of physical manipulation, such as shown in FIG. 12.

Figure 35:
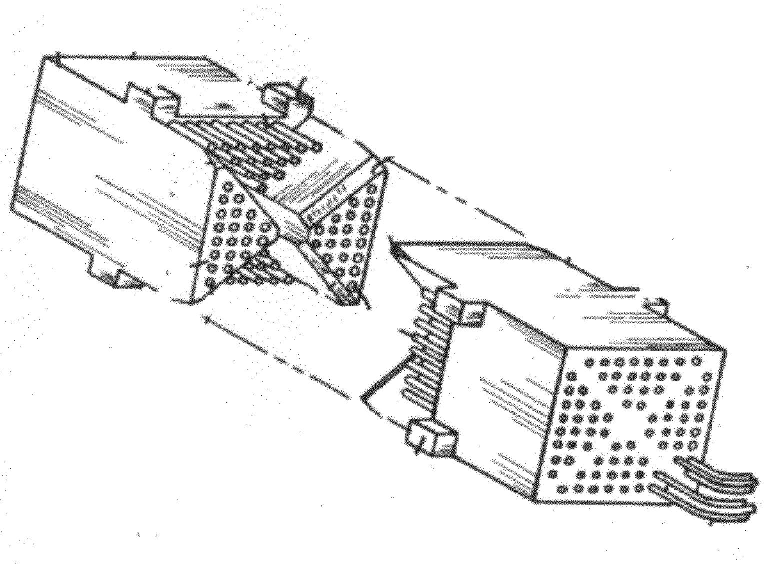
FIG. 35 illustrates the prior art bowtie connector and orthogonal board configuration according to the prior art.

For example, as discussed above, the carousel 100 preferably, but not necessarily, uses commercially available boards 102 which are already configured with connectors. Each plate 202 could be configured with a corresponding mating connector 204. However, this may limit the number of plates 202 to the number of connectors 204 on any given board, e.g., 34 in current commercial embodiments. While this would still provide a novel arrangement of circuit boards and interconnection structure and methodology, it may not provide any increase over the number of boards that could be connected via the standard orthogonal method of the prior art. Alternatively, several plates 202 can share a common connector 204. For example, four (4) plates 202 may share the same connector while providing sufficient connective pathways. It is to be noted that the number of plates 202 connecting to the connectors 204 is not limited to a particular number. The pin interfaces of connectors 204 could be bowtie connectors such as shown in FIG. 35, or any other appropriate connector.

Figure 11:
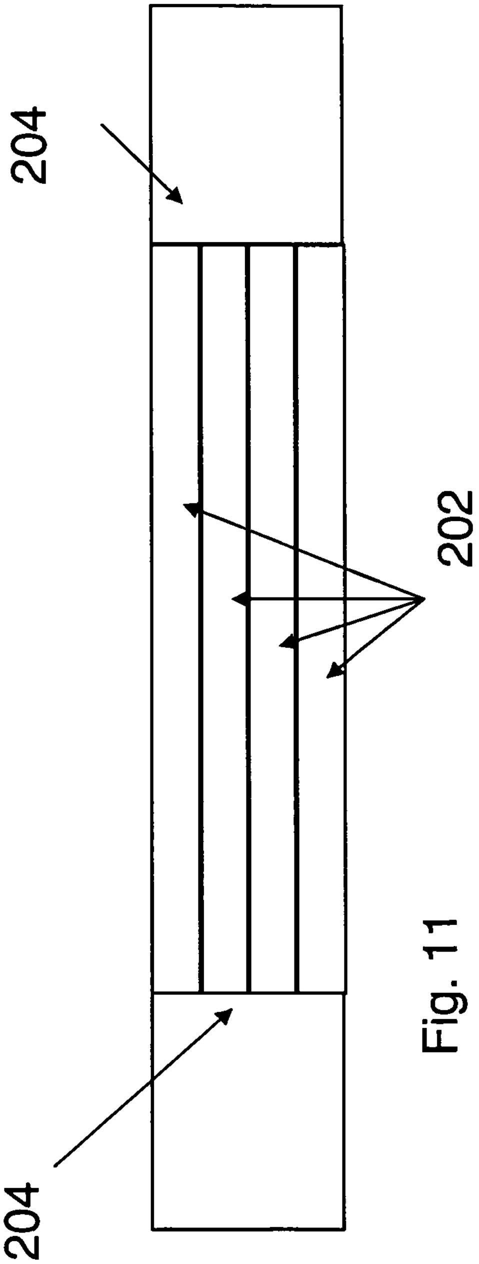
FIG. 11 shows a cross-section of several plates sharing connectors.

A non-limiting example of this is shown in FIG. 11, showing a cross section of four (4) plates 202 taken through two roughly opposing connectors 204. Each plate 202 will avail itself of some of the pins in connector 204. By allocating four (4) plates to each connector 204, the provision of 34 connectors 204 allows for 136 (34×4) plates 202 in central hub 104. This allows for the connection of 135 different circuit boards 102 (one pathway of the 136 being reserved for an individual board 102 to communicate with itself). This is not only a roughly two-fold improvement in the number of circuit boards over the noted prior art orthogonal design, but there are no indirect communication pathways to slow the system down. It is to be noted that numbers are illustrative only and do not limit the scope of the invention. It is also to be noted that carousel 100 need not be fully utilized (e.g., less than maximum boards may be used), and that some boards (in whole or in part) may be used to interface with external components.

Figure 12:
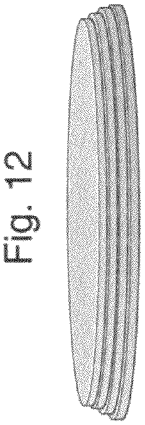
FIG. 12 shows stacked plates of the hub with concentrically decreasing diameters.
Figure 13:
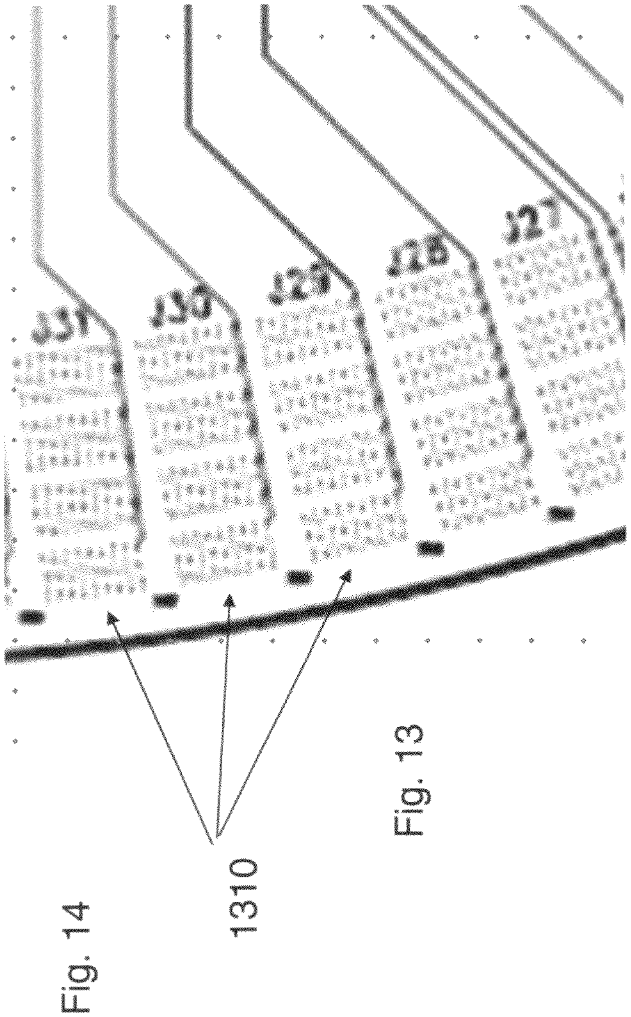
FIG. 13 shows a top view of an edge of the stacked plates shown in FIG. 12.
Figure 14:
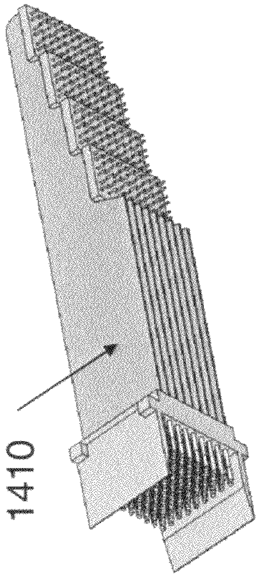
FIG. 14 shows a connector configured to connect with the stacked plates of FIG. 12.

FIG. 12 shows another embodiment for accommodating multiple plates 202 with a single connector. In FIG. 12, four plates 202 have the same pathway layout, but have a sequentially decreasing diameter to form tiers. This configuration is referred to herein as a "wedding cake." Banks 1310 of upwardly facing female pins radially align along the top of each plate 202 along the perimeter. A close-up view of the banks 1310 is shown in FIG. 13. Referring to FIG. 14, a tiered connector 1410 has downwardly facing male pins separated into tiers, and the distance and height between tiers corresponds to the tiers of the stacked plates 202 in FIG. 12. Connector 1410 is lowered into the stack of plates 202 and shown in FIGS. 15 and 32C.

Figure 44:
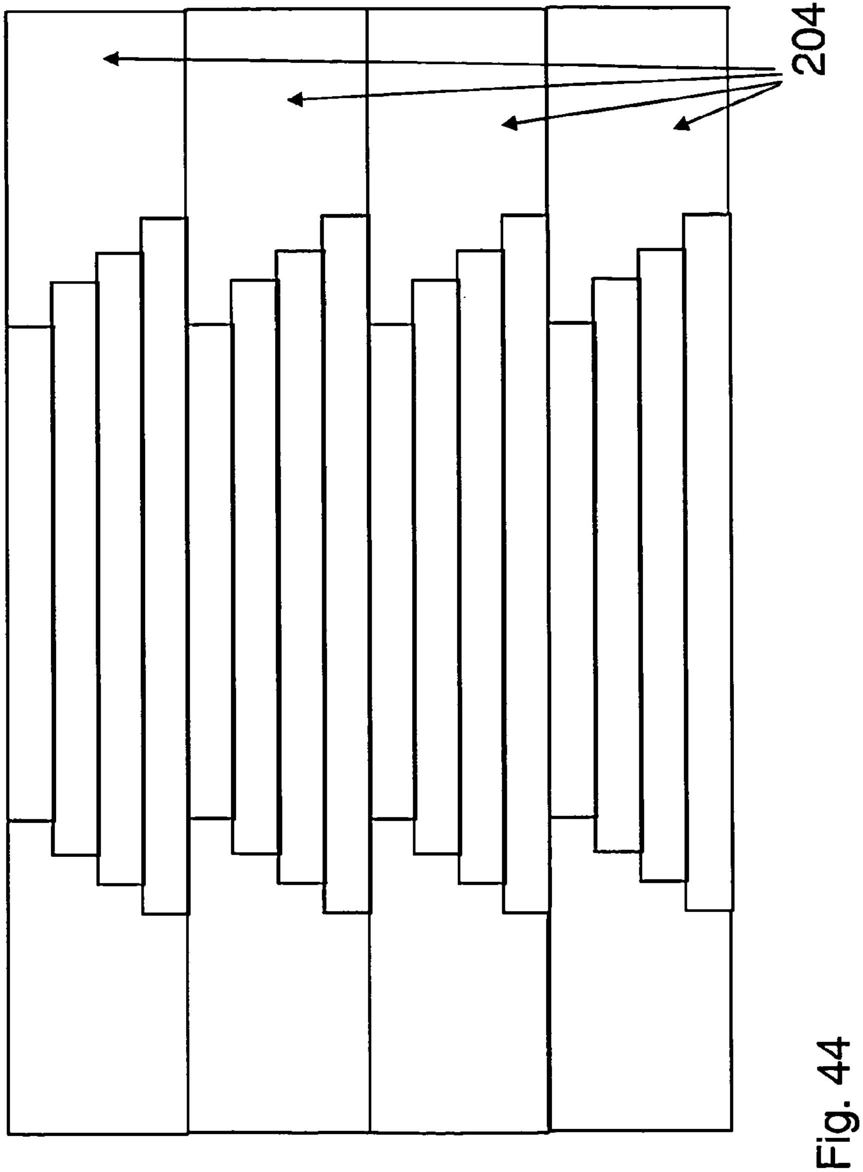
FIG. 44 shows a stacked wedding cake configuration of plates.

In theory, the wedding cake configuration could extend from the lowest plate 202 to the top of the hub 104. While this is configuration is within the scope of the invention, it is not considered practical as the top plate 202 would be small compared to the size of the connector. Rather, the wedding cake configuration is preferably used for groups of four plates 202 which are stacked on each other, as shown in FIG. 44.

Figure 18:
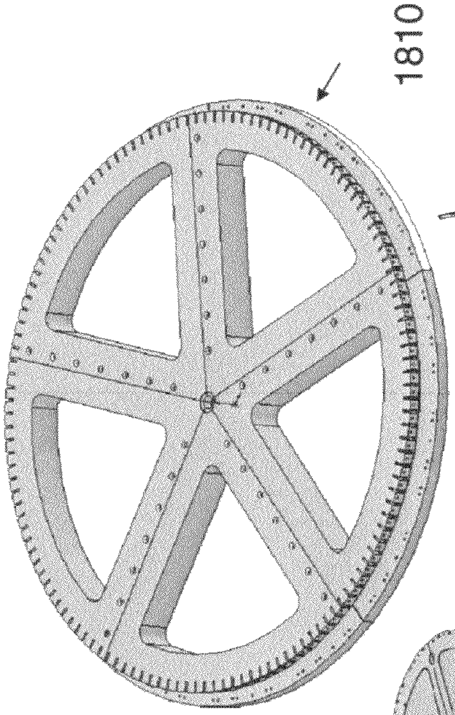
FIG. 18 shows a support ring which serves as the lower base of the central hub.
Figure 17:
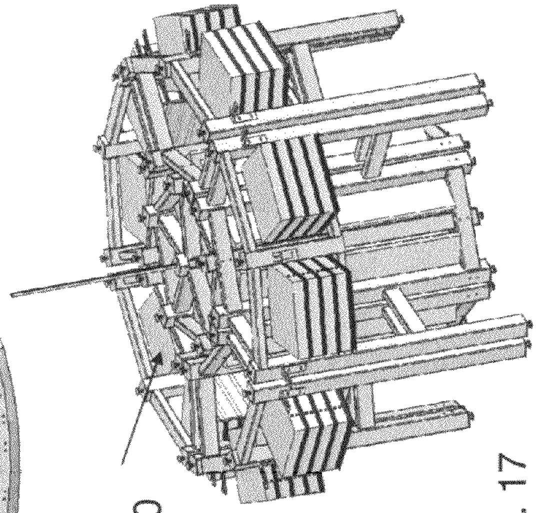
FIG. 17 shows an perspective view of a base on which the central hub is mounted.
Figure 16:
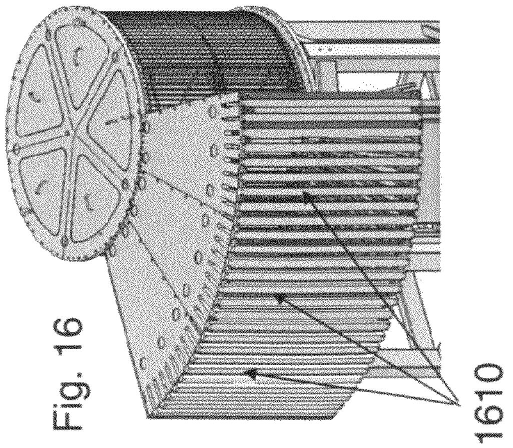
FIG. 16 shows an embodiment of wedge shaped supports that connects to a central hub to hold vertical circuit boards.

Referring now to FIGS. 16-18, the support structures for the carousel 100 are shown. FIG. 16 shows wedge shaped supports 1610 which connect to central hub 104 to hold circuit boards 102 (three such supports are shown in FIG. 16). FIG. 17 shows an perspective view of a base 1710 on which the central hub 104 is mounted. FIG. 18 shows a support ring 1810 which serves as the physical base of central hub 104 on which the plates 202 will lay.

Figure 19B:
FIGS. 19A and 19B show a perspective view of the support wedge depicted in FIG. 16.
Figure 19A:
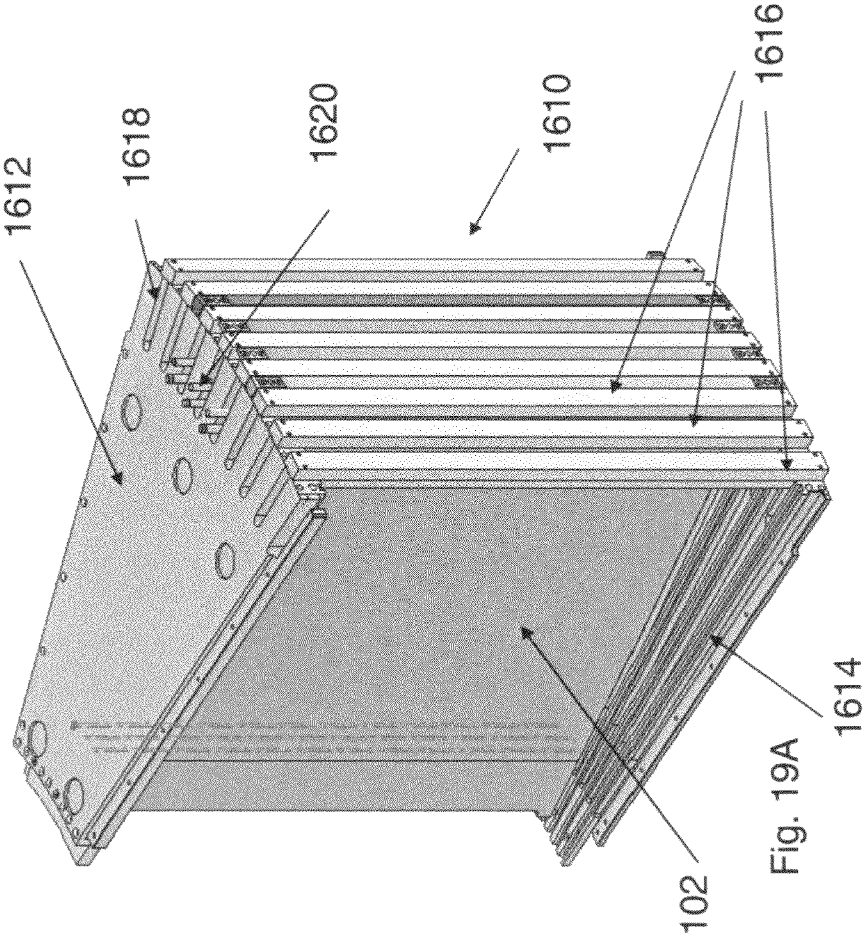

FIGS. 19A and 19B show a perspective view of wedge 1610. Top and bottom wedge shaped plates 1612 and 1614 are held in place by lateral supports 1616. Gaps between lateral supports 1616 serve as the openings to insert and remove circuit boards 102. Lateral supports 1616 also support the heat sinks 110 (not shown in FIG. 19). Recesses 1618 in the top and bottom of plates 1612 and 1614 (only in the top of 1612 is shown) allow for the passage of tubes 1620 through the wedge shaped plates. As discussed in more detail below, the tubes 1620 provide pathways to circulate fluid to heat sinks 110.

Figure 20:
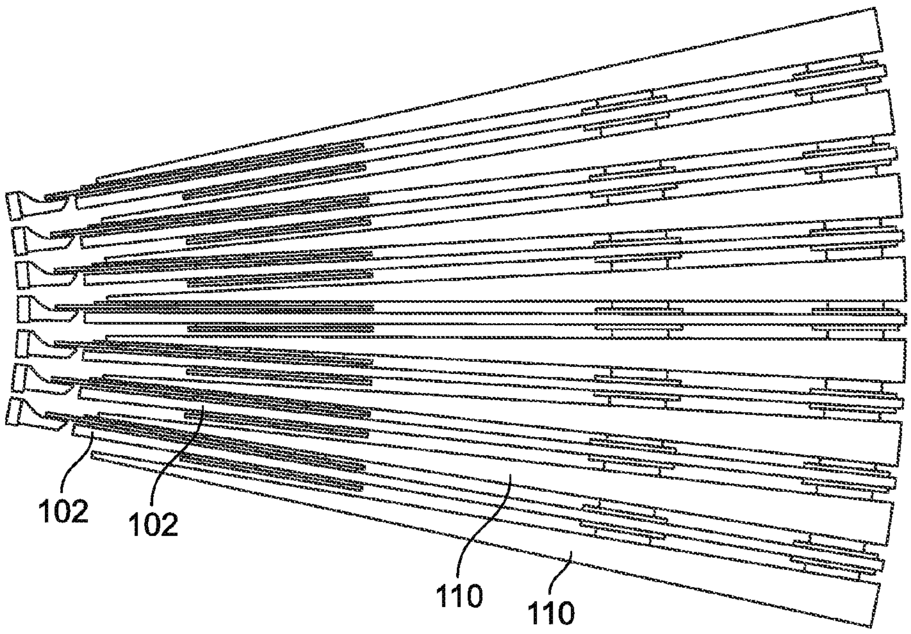
FIG. 20 is a top view of an embodiment of a central hub, circuit boards, and interspersed heat sinks.

Referring now to FIG. 20, the circular shape of carousel 100 positions the vertical circuit boards 102 at small individual angles to each other. As a result, the boards 102 are not parallel, but have wedge shaped gaps therebetween that widen further away from central hub 104. This extra distance allows for processor chips and related components to be placed on both sides of board 102, either exposed or covered with appropriate heat transfer materials (e.g., metal plates). The extra distance also allows for the optional insertion of heat sinks 110 between adjacent circuit boards 102. Heat sinks 110 are preferably wedge shaped to leverage the wedge shape gap between circuit boards 102, although the exemplary embodiments of the present invention are not limited to any specific size, shape, composition or type of heat sink.

Figure 21:
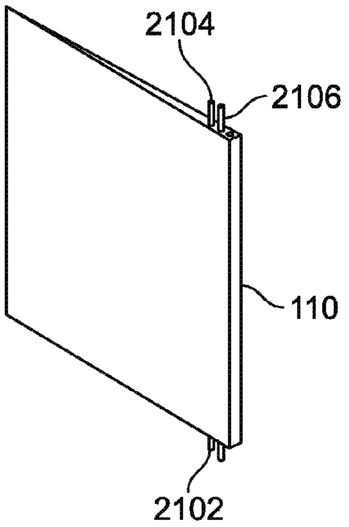
FIG. 21 is a perspective view of a heat sink configured to fit between adjacent circuit boards.
Figure 22:
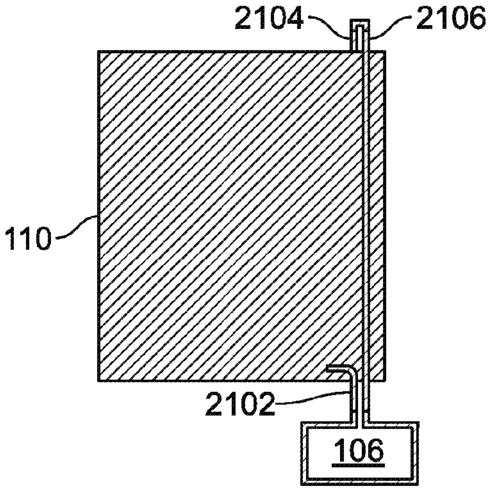
FIG. 22 is a cross section of a heat sink configured to fit between adjacent circuit boards.

FIGS. 21 and 22 show a non-limiting example of a heat sink 110 for use in carousel 100. Five (5) walls define the wedge shape, and tubes 1620 carry fluid into the enclosure. A lower tube 2102 serves as a fluid inlet, an upper tube 2104 serves as a tube outlet, and a long tube 2106 acts as a return tube. Fluid is provided by coolant containers 106 (FIG. 1) along with pressure control equipment known in the art to regulate the flow of fluid into and out of the heat sinks 110.

Heats sinks 110 are preferably, but not necessarily, elastic, in that they expand under applied positive pressure and contract under applied negative pressure. They are also preferably, but not necessarily, semi-rigid, in that they will expand or contract under appropriate pressure and return to their original shape when pressure is normalized. Thin stainless steel on the order of approximately 0.030-0.40 inches thick, preferably approximately 0.036 inches thick, is suitable for this purpose, although other materials and thicknesses may be used. Negative pressure can be applied to contract heat sink 110 to allow for easier insertion and removal of circuit boards 102. Positive pressure can then be applied to expand heat sink 110 to bring its lateral surfaces into direct contact with the lateral surfaces of circuit board 102 (which may be the exposed electrical components, intermediary metal heat sink, etc.) This provides for substantially superior cooling options compared to prior art orthogonal connectors, which typically rely on air coolant due to the lack of space between adjacent parallel circuit boards.

The above embodiments present numerous advantages over the prior art in both size, cost and efficiency. For an embodiment of FIG. 2 with 135 boards, the following are comparison statistics as compared with the IBM BlueGene/L and Cray Red Storm system (as understood from publicly available literature) discussed above:

TABLE 1

| | Embodiment of FIG. 2 w/ 135 boards | IBM | Cray Red Storm |
|---|---|---|---|
| Sq Ft floor space | 200 | 2500 | 3500 |
| Cabinet | 1 | 64 | 175 |
| Memory | 128 TB | 32 TB | 75.9 TB |
| Processor Cores | 16.384 | 128,000 | 25,920 |
| TFLOPS | 78 | 360 | 124.4 |
| Megawatt | 0.7 | 1.0 | 2.2 |
| Coolant | Liquid | Air | Air |
| Full Graph Bisection | 40 TB/s | 1.2 TB/s | 10 TB/s |

As the above chart shows, the exemplary embodiments described herein provide superior performance to the noted systems for only a fraction of the size requirements. The most significant improvement is in bisection bandwidth, which is over 30 times better than IBM's system and 10 times Cray Red Storm's system. The relatively small size compared to the noted system translates into a corresponding reduction in costs of the system due to a reduction in the number of parts and floor space needed to maintain it.

Figure 23:
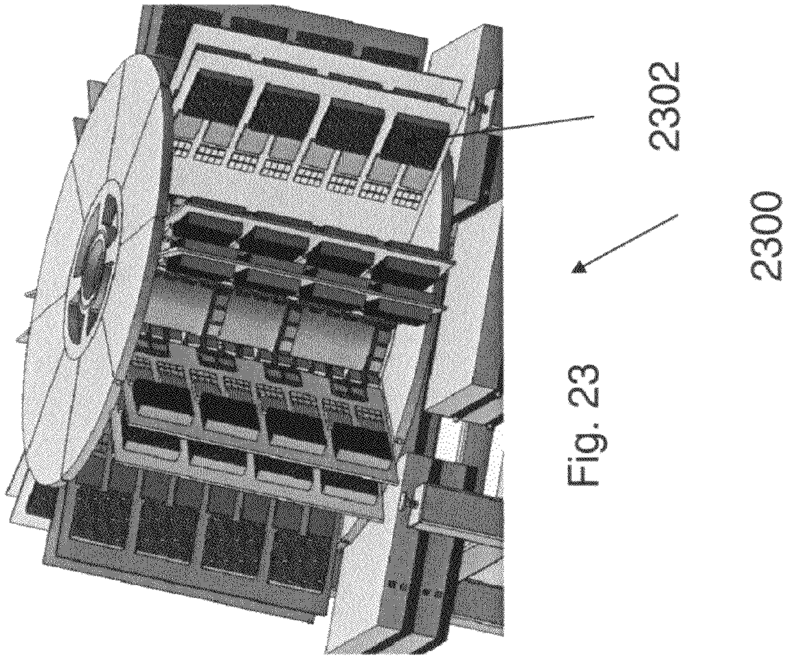
FIG. 23 is a perspective view of another embodiment of the invention.

FIG. 23 shows another embodiment of a carousel 2300. In this embodiment, not all available space is utilized by circuit boards 2302, potentially leaving larger gaps between adjacent boards which may or may not be filled with a heat sink 2310 (not shown) akin to heat sinks 110. The noted components are preferably smaller than their corresponding components in carousel 100 to provide a smaller and less expensive option. However, the invention is not so limited, and the components may be the same size and/or larger than shown for carousel 100. Carousel 2300 preferably has 40 circuit boards 2302, which provides approximately 16 TB global memory at 2.7 TB/s bisection bandwidth with an 80 Kwatt power requirement over 64 square feet. It is to be noted that numbers of boards, memory, bandwidth and power are illustrative only and do not limit the scope of the invention or any individual claim unless expressly recited in that claim. It is also to be noted that the connections in the carousel need not be fully utilized (e.g., less than maximum boards may be used), and that some boards (in whole or in part) may be used to interface with external components.

Figure 24:
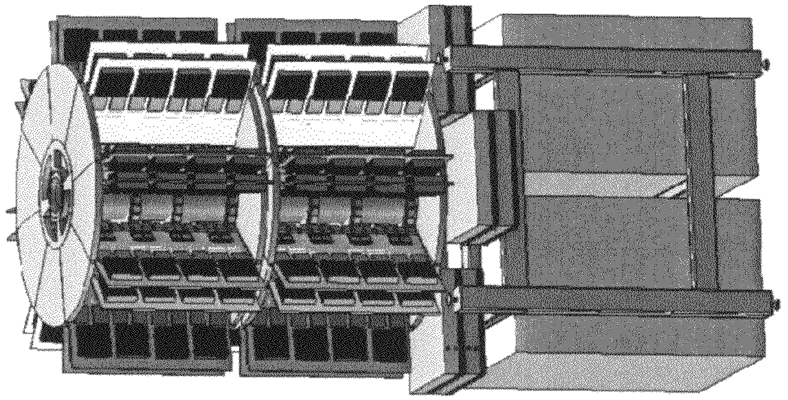
FIG. 24 is a perspective view of a stacked embodiment of the invention.

Carousels 100 and 2300 are preferably, but not necessarily, stand alone units. If more circuit boards 102 are necessary then an additional carousel 100 is used. One or more of the connector boards 102 from the different carousels 100 would connect to form a connection between the two. In the alternative, as shown in FIG. 24, a second central hub could be mounted above the unit (FIG. 24 shows two carousels 2300) and the two could share support systems and cooling mechanisms, although attention must be given to account for weight and stability. Doubling the size in this matter roughly doubles the power requirements, memory, and bisection bandwidth.

Figure 25:
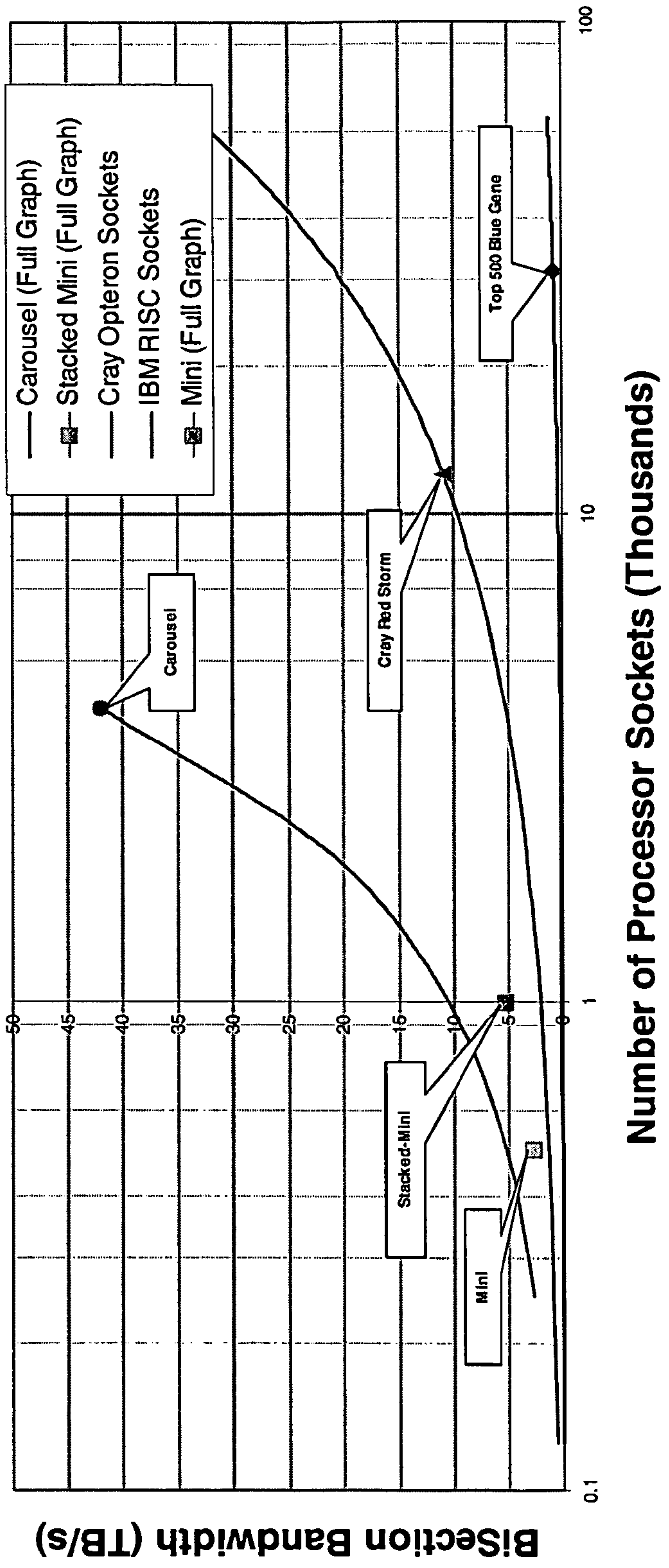
FIG. 25 is a graph of bisection bandwidth of embodiments of the invention and prior art systems.

FIG. 25 shows a bisection bandwidth comparison of the carousels shown in FIGS. 2, 23, and 24 as compared with the IBM and Cray systems. All embodiments herein provide substantially superior bisection bandwidth compared with the prior art systems.

Figure 26:
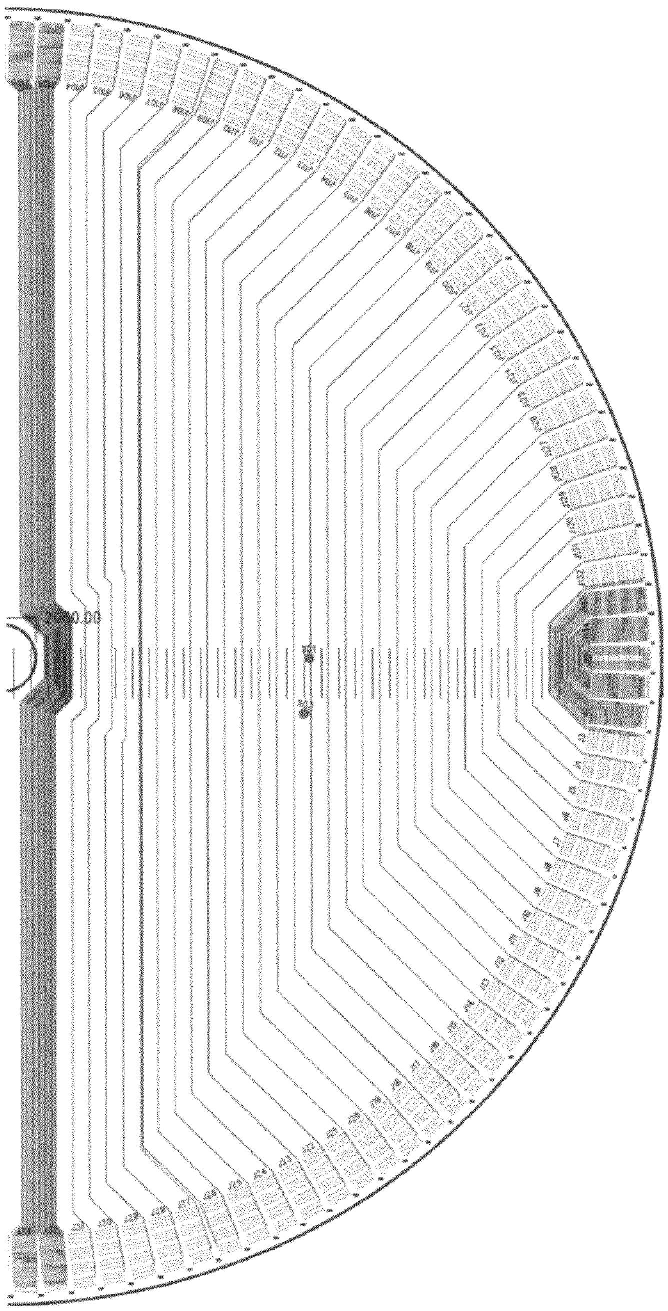
FIG. 26 is a top view of another embodiment of a portion of a plate of a central hub.

Plate 202 will have the number of necessary pathways to facilitate the connections discussed herein. FIG. 26 shows an example of a portion of a plate 202 that connects to about half of the boards 102 in an embodiment that supports 135 total boards.

Data flow between the various circuit boards 102 through the central hub 104 is not limited to any specific type, format, or organization of signal. Preferably, the data flow occurs via differential signaling. Differential signaling is a method of transmitting information electrically by means of two complementary signals. Differential signals may have a characteristic of being tightly coupled or loosely coupled. In a loosely coupled arrangement, the two differential signals are each referenced to a separate ground signal; this configuration has the benefit of eliminating the need for any strict physical arrangement between the signal pathways, but requires a total of four (4) signal paths to communicate the complete signal. In a tightly coupled arrangement, the signal pathways maintain a precise physical relationship so that the two signals are subject to the same physical environment and are thus equally subject to interference; this configuration has the drawback of a precision requirement in the signal pathways, but has the benefit of communicating the complete signal using only two (2) signal pathways and without the need for any independent ground signals.

Signals are communicated at various speeds, with high speed and low speed applications. Due to technical and practical obstacles, use of tightly coupled differential signals has been limited primarily to low speed environments of ~100

Mbps, typically as a twisted pair in Ethernets. Most high speed multi-Gbps designs use loosely coupled differential signaling. The invention can operate with such loosely coupled differential signals.

However, there may be limitations on the number of available signal pathways. For example, if bowtie connectors are used on circuit boards 102, such commercially available connectors have a current maximum of 9×9 pin pairs for a total of 162 pin/socket combinations. This would only accommodate at most 40 loosely coupled differential signals, but 81 tightly coupled differential signals. The use of tightly coupled differential signals, while counter-intuitive for this environment because of its high speed, is nonetheless preferable if the architecture can be designed in a way which addresses the impedance and crosstalk drawbacks inherent in such signals as present in the carousel. This primarily addresses the design of plate 202 and connectors 1410. A preferred non-limiting example of such a connector is discussed below.

Figures 27A, 27B, 27C:
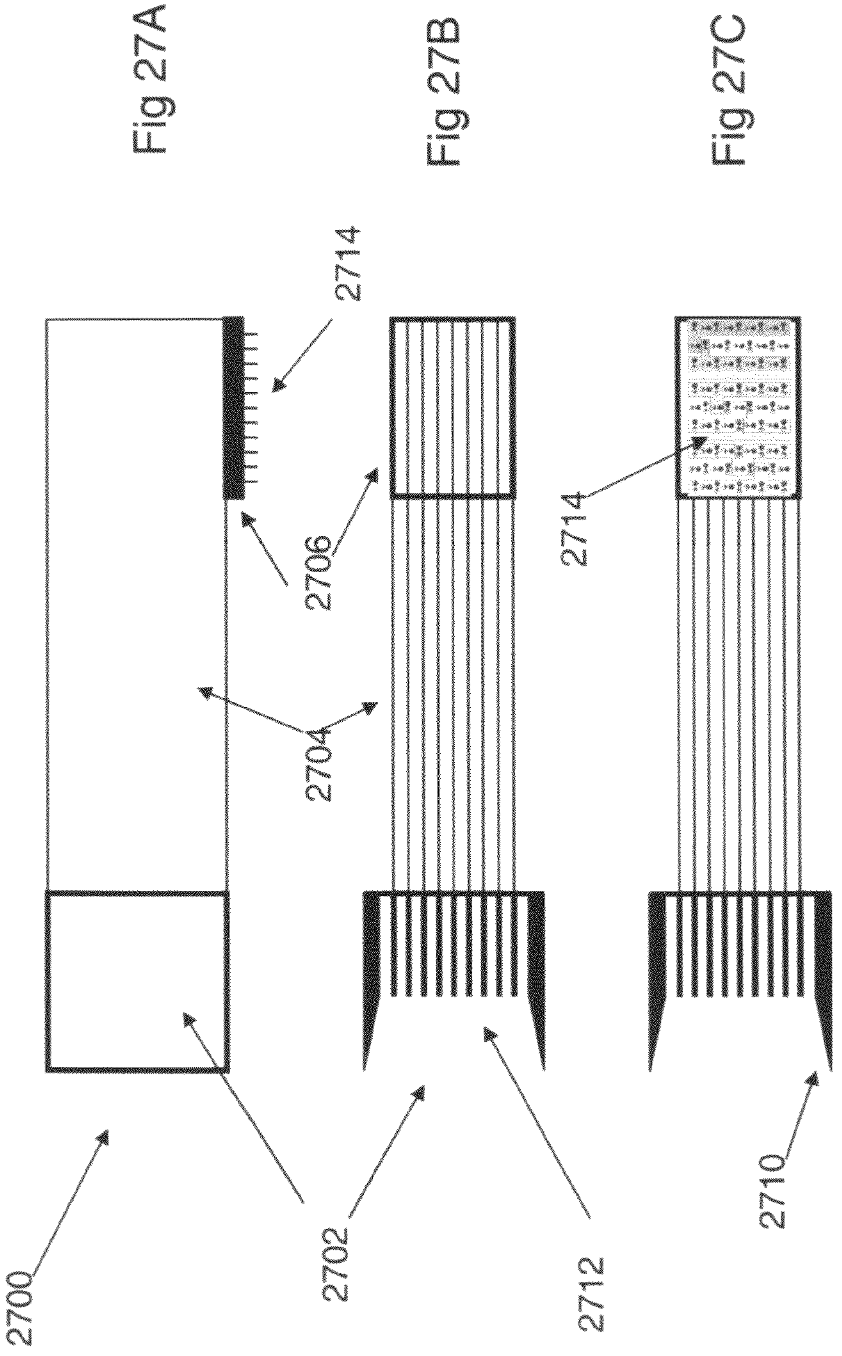
FIGS. 27A-27C illustrates top, bottom and side views of a connector according to an embodiment of the invention.

We begin with connector 1410 at the conceptual level. FIGS. 27A-27C show side, top and bottom views respectively of an embodiment of a connector 2700 according to an embodiment of the invention that incorporates and illustrates some of the features of connector 1410. Connector 2700 includes a header 2702, a plurality of flexible circuit boards 2704, and a footprint 2706. Header 2702 will connect to different circuit boards 102 and/or other connectors (not shown in FIGS. 27A-27C), footprint 2706 will connect to plates 202, and flexible printed circuit boards 2704 will transmit the signals therebetween. Connector 2700 is configured for orthogonally positioned circuit boards, such that the pins 2712 of header 2702 (generally extending horizontally in FIGS. 27B and 27C) are perpendicular to the pins 2714 of the footprint 2706 (generally extending vertically in FIG. 27A). This orientation presumes that flexible printed circuit boards 2704 are in their natural state. However, it is noted that the flexible boards 2704 can be bent to assume other positions, such that the ultimate pin placement may not be perpendicular. This is particularly useful for orthogonal boards that are not in perfect alignment, as the flexibility of flexible circuit boards 2704 can accommodate mechanical offset or play as needed.

Figure 28A:
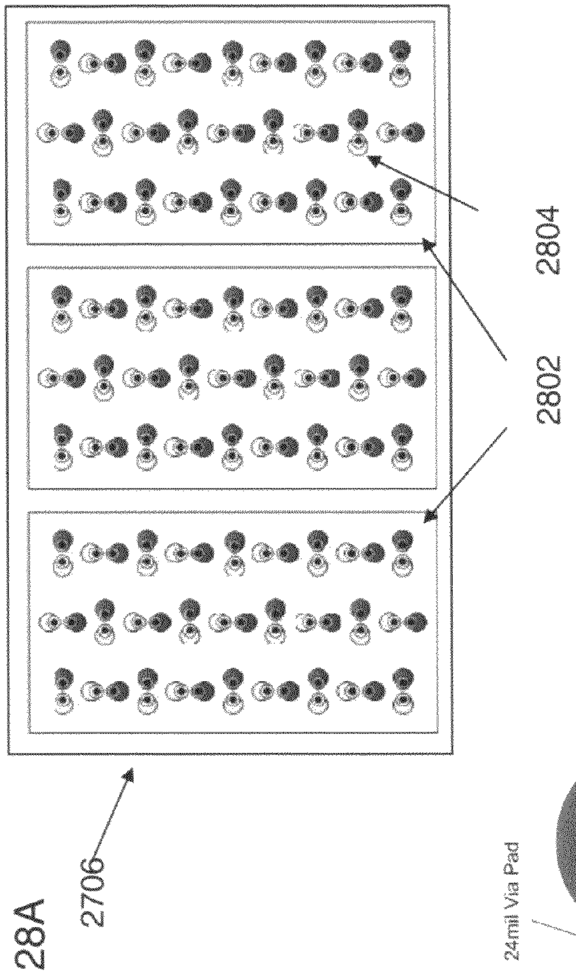
FIGS. 28A and 28B illustrate a footprint of a connector according to an embodiment of the invention.
Figure 28B:
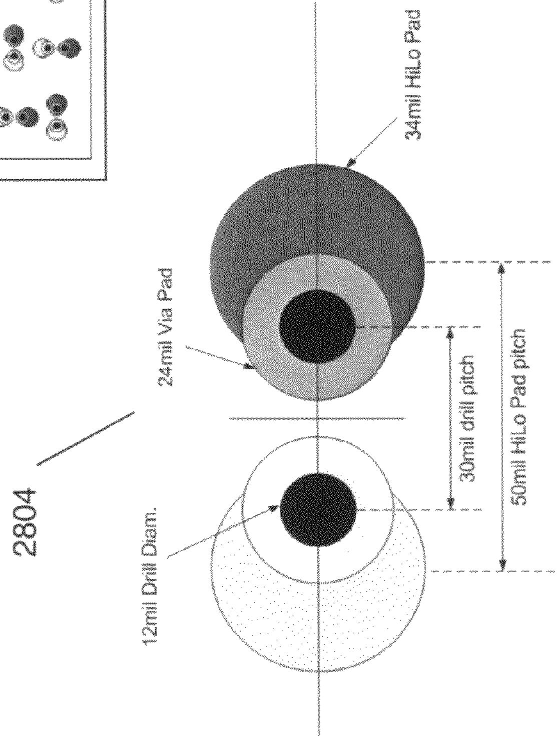

FIG. 28A shows a bottom view of the footprint 2706, and FIG. 28B shows a close up of a pin pair 2804 within footprint 2706. The footprint may be a single integral component or made up of several different subsections 2802 as shown in FIG. 28A. In either case, pin pairs 2804 are positioned substantially uniformly across footprint 2706. The symbols shown in FIG. 28 are for female pins, although male pins are preferred such as shown in FIG. 14. Combinations of male and female pins may also be used. FIG. 28A shows 81 different pin pairs, configured into twelve nine (9) columns and nine (9) rows (i.e., a 9×9 matrix). However, the invention is not so limited, and the connector may employ any shape or number of pins as may be appropriate for a particular operating environment.

Each pin pair 2804 is arranged orthogonally to each adjacent pin pair, such that the pin pairs 2804 alternate in the horizontal and vertical direction. The arrangement is such that the center points of each pin pair substantially align to form a uniform non-overlapping grid. This asymmetric physical arrangement of pins reduces crosstalk relative to the symmetric orientation of pins in typical bowtie connectors. Within each pin pair 2804, the left most or topmost pins are preferably assigned to the positive component of the tightly coupled differential signal, while the right most or bottommost are preferably assigned to the negative component. The opposite arrangement could also be used. The signal arrangement could also be mixed, although this may bear on the overall performance of the connector and the systems connected thereto.

The pins 2804 are preferably HILO™ or GIGASNAP™ pins. The pins preferably have the following approximate dimensions based on an approximately 34 mil HILO™ pin pad: a drill diameter of 12 mils, a 24 mil drill pad surface, a 30 mil drill pitch, and a pad pitch of 50 mils. The center point of adjacent pin pairs in the same column are at preferably approximately 75 mils. The center point of adjacent pin pairs in the same row is preferably approximately 100 or 125 mils.

Referring now to FIGS. 29A and 29B, header 2702 includes multiple pin pairs 2902. The sides 2710 of header 2702 are preferably tapered (see FIGS. 27B and 27C) to assist in the insertion/connection of header 2702 with another appropriate connector. Each of the pin pairs 2902 within sides 2710 lies in a substantially diagonal relationship. However, the distance between the pins within a pin pair 2904 is less than the distance between adjacent pin sets, which assists in minimizing crosstalk. By way of non-limiting example, the centers of pins within a pin pair 2904 are preferably approximately 32 mils apart, the centers of adjacent common pins (e.g., two leftmost pins) is preferably approximately 80 mils apart, and the centers of adjacent conjugate pins (e.g., a rightmost pin and leftmost pin) is preferably approximately 62 mils apart. These dimensions provide for improved crosstalk and impedance control. To accommodate the dimensions, the individual pins are preferably OMNETICS™ NANOCONTACT™ pins.

Similar to FIGS. 28A and 28B, header 2702 in FIG. 29A shows 81 different pin pairs, configured into nine (9) columns and nine (9) rows. However, the invention is not so limited, and the connector may employ any shape or number of pins as may be appropriate for a particular operating environment. Header 2702 may have the same number of pins as footprint 2706 shown in FIG. 29A, or a different number of pins. FIG. 29A shows the alignment of flexible printed circuit boards relative to the pin placement on header 2702; the vertical boards are flexible printed circuit boards 2904 of connector 2700, whereas the horizontal boards are representative of flexible printed circuit boards of another orthogonal connector (not shown) which is connected to connector 2700.

Figure 30:
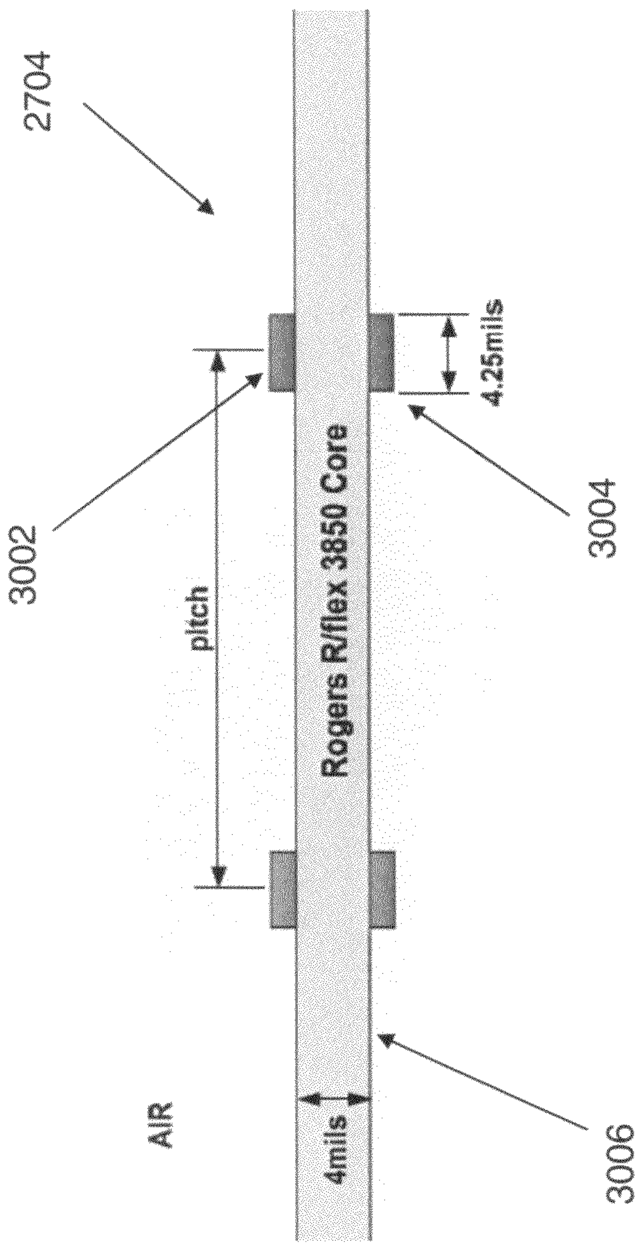
FIG. 30 illustrates a flexible printed circuit board of a connector according to an embodiment of the invention.
Figure 31:
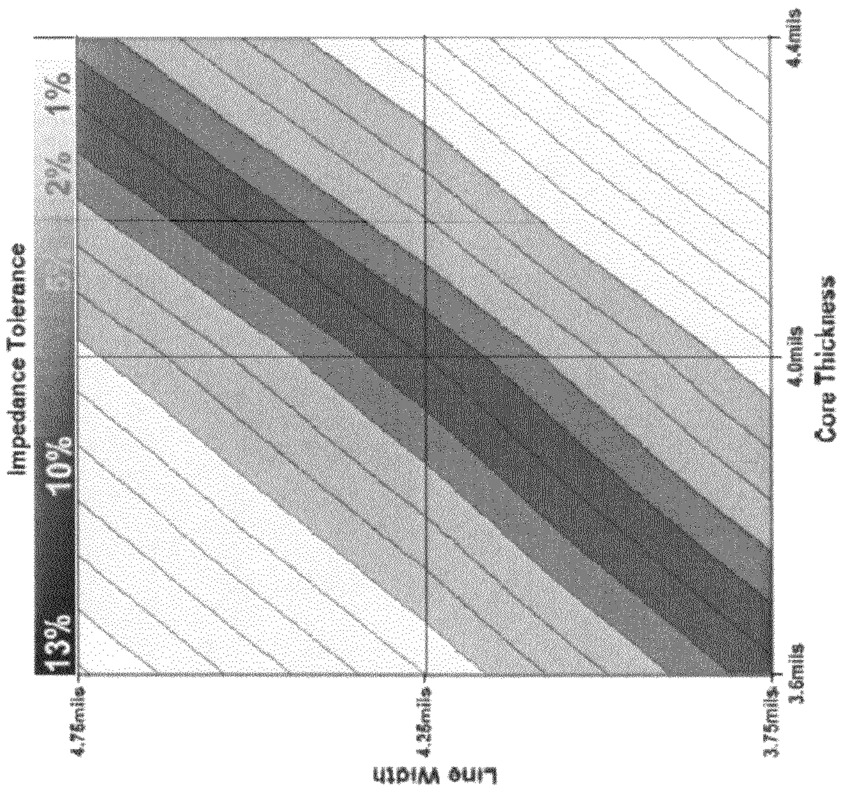
FIG. 31 illustrates an impedance tolerance chart for the flexible printed circuit board of FIG. 30.

FIG. 30 shows a cross section of one of the flexible printed circuit boards 2704. To maintain the tightly coupled relationship, the two components of the signal pairs are sent over two conductive pathways 3002 and 3004 on substantially direct opposite sides of the flexible printed circuit board 3006. The underlying core material is preferably a ROGERS™ R/flex 3850 core approximately 4 mils thick, ±10%. The conductive pathways 3002 and 3004 are preferably made from copper approximately 4.25 mils thick and 1.3 mils in height, again ±10%. FIG. 31 shows an impedance tolerance chart of the relationship between pathway thickness and core thickness. The pathways preferably have a substantially uniform impedance of approximately 100 ohms, ±13% based on structural variances in the construction of the boards. This configuration produces a physical environment that reduces crosstalk between adjacent pathways and maintains the physical relationship between the component signals of the tightly coupled differential pair.

Figure 15:
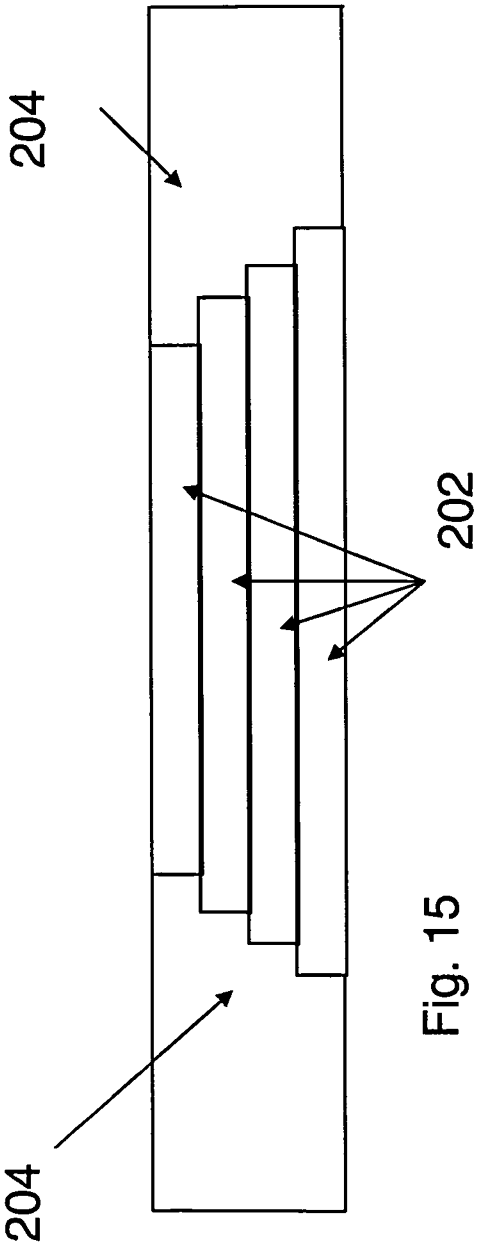
FIG. 15 shows a cross-section of several plates of FIG. 12 sharing connectors.
Figures 32A, 32B, 32C:
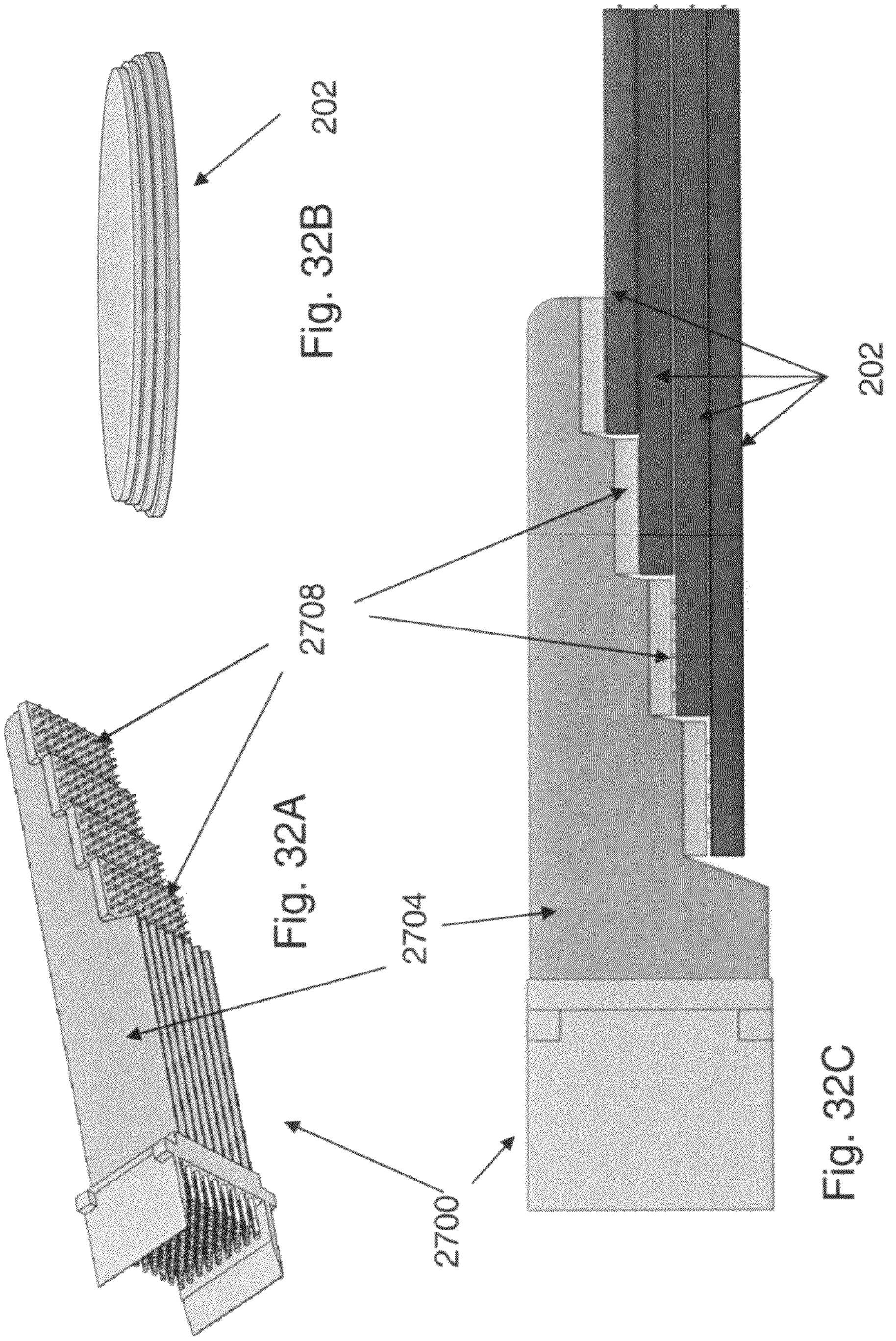
FIGS. 32A-32C illustrate a connector according to another embodiment of the invention.

FIGS. 32A-32C show another embodiment of connector 1410 having the features discussed with respect to FIGS. 28-31 above, with additional features specific to the design of FIG. 14 for the environment of FIG. 15 discussed above. In this embodiment, footprint 2706 has several subsections 2708 which are offset from each other to create different shapes. FIG. 32A shows a staircase arrangement, but other configurations could also be used as need to conform to the surrounding environment. Flexible printed circuit boards 2704 have mating recesses to support the stacked footprint 2706. This stacking is particularly useful to engage with a circuit board(s) that presents a multi-level engagement surface, such as the "wedding cake" configuration of plates 202 in FIG. 32B. Individual pin pairs are allocated to the various subsections as necessary or desired. Four subsections 2708 are shown in FIGS. 32A-32C, although any number as appropriate may be used.

In some cases, the tightly coupled differential signals are part of a group of related signals. Maintaining a tight grouping of these signals can improve the design and/or the overall operation of the system. In theory, the groups can be maintained by corresponding allocation of the signals to specific clusters of signal pathways. For example, three (3) signals may be assigned to three (3) signal pairs in a row or columns of the connector 1410 or 2700.

In some cases, however, constraints within the system prevent the type of uniform grouping as above. For example, an 8-bit HyperTransport signal—which is a preferred but non-limiting data signal format for the embodiments of the invention—requires 10 different signal pair pathways for each signal: eight (8) data signals, one (1) clock signal and one (1) control signal. In theory a connector configured with pin pairs in an 8×10 configuration would be adequate for this task. However, in some orthogonal environments, such as U.S. Provisional Patent Application Ser. No. 60/935,717, it may be difficult to utilize a connector of that large a size. Also, there is an industry design bias toward square-shaped connecters. As noted above, the largest commercially available connector is a 9×9 configuration.

Figure 33:
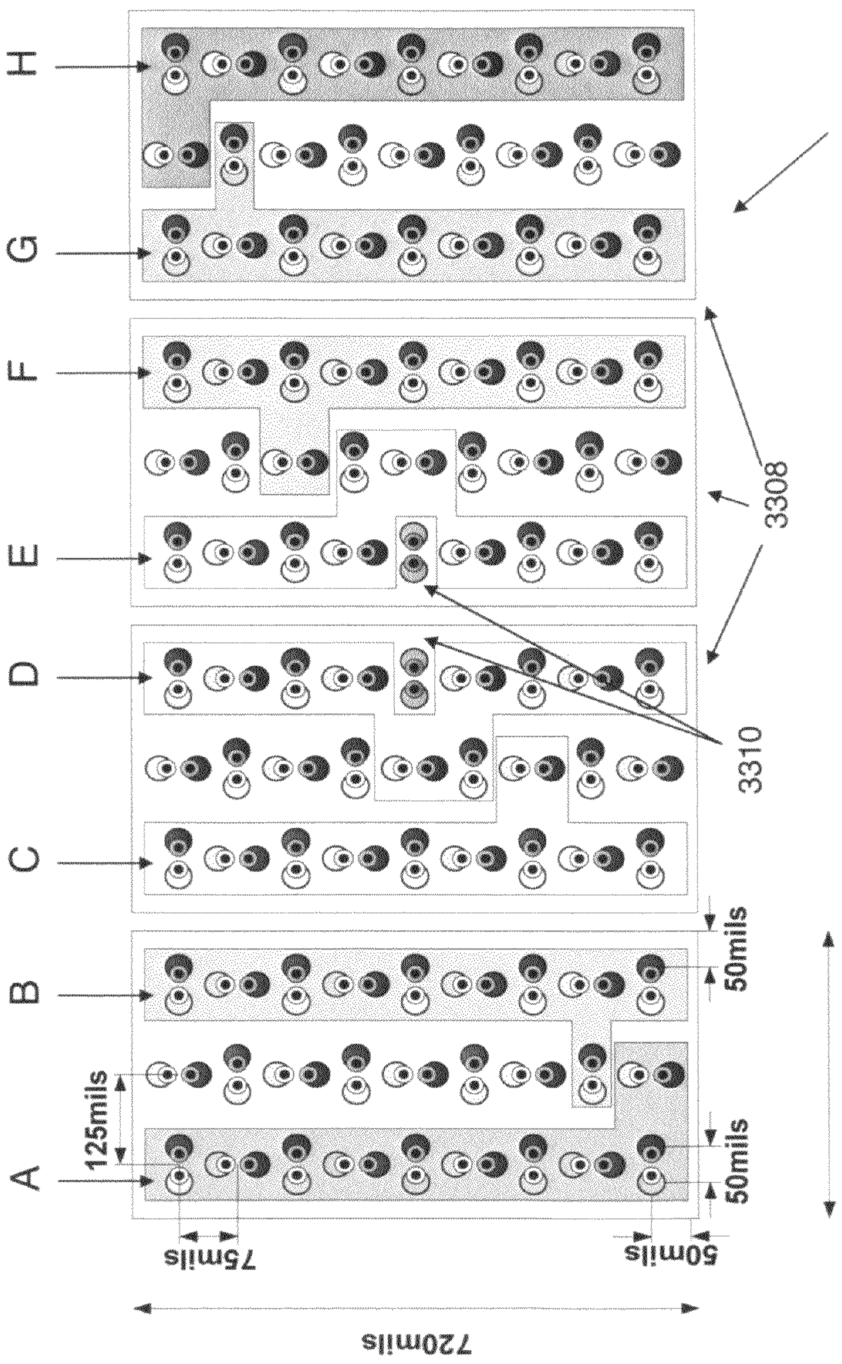
FIG. 33 illustrates a footprint of the connector in FIG. 32A with signal assignments.
Figure 34:
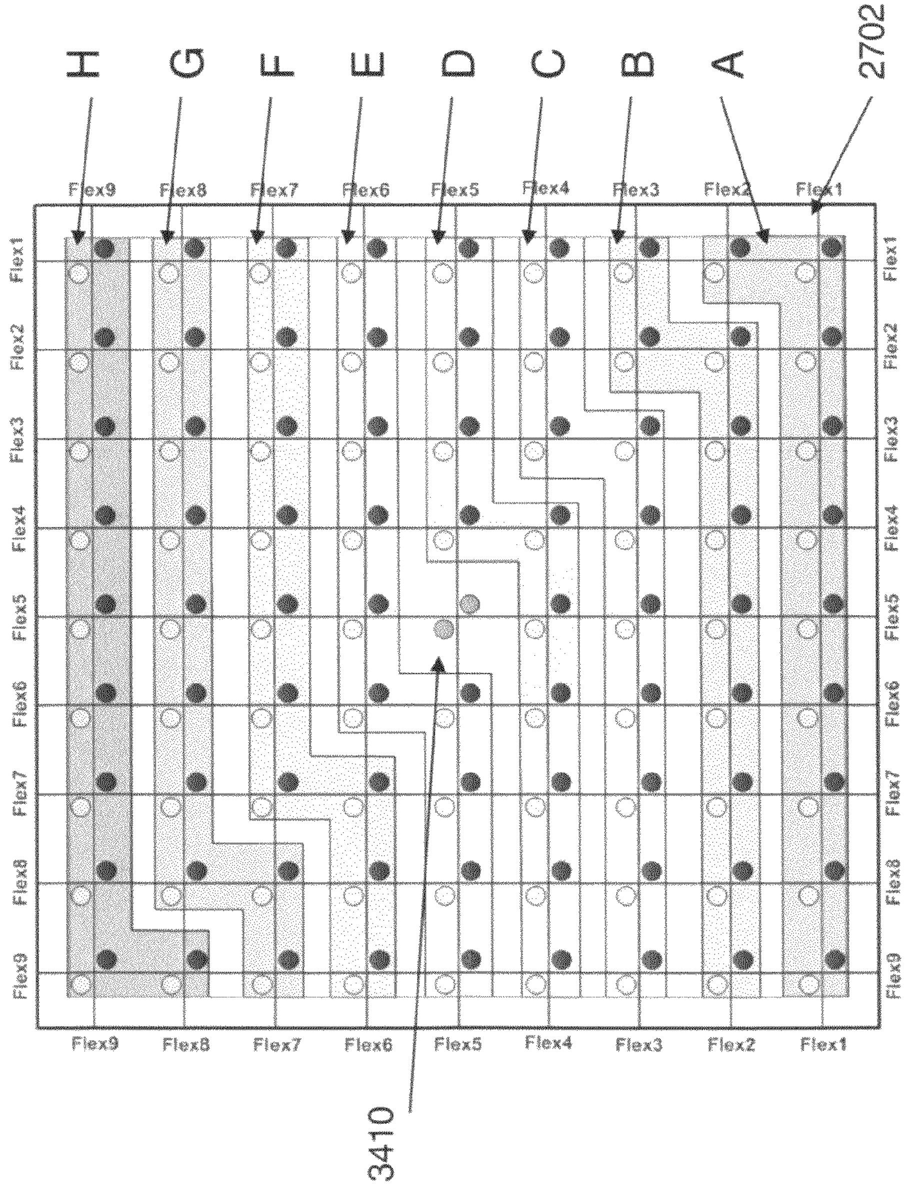
FIG. 34 illustrates a header of the connector in FIG. 32A.

FIGS. 33 and 34 show a specific allocation of signal pins over connector 1410 that allows for the transmission of an 8-bit HyperTransport signal on a 9×9 matrix, and specifically the footprint 3306 and a header 2702 of a connector that addresses this environment, respectively. Header 2702 has the same configuration as shown in FIG. 14, as it provides a 9×9 configuration of pin pairs; the resulting 81 pins are sufficient to handle the 80 signal pairs necessary, along with a ground pin pair 3410 if desired. However, the footprint 3306 differs from that in FIGS. 28A and 28B in that it contains more pins than the header 2702. Specifically, the footprint 3306 includes 12 columns of 9 pin pairs, for a total of 136 signal pairs. Only 80 of the pin pairs (and potentially additional ground pin(s)) are needed and thus have pathways to the corresponding pin pairs in header 2702. The remaining pin pairs are either not used, not connected to the flexible printed circuit board 2704 (which may optionally not even have pathways provided for the unused pin pairs), and/or connected to a common ground signal. In the alternative, the unused pins could be omitted altogether. The footprint 3306 may be level as in FIG. 28A or have offset sections as shown in FIGS. 15 and 32C.

To establish the grouping at the footprint 3306, two (2) of the eight (8) signals are assigned to each of the subsections 3308 per the allocated labels A-H. The signal allocations A and B are assigned to the first (leftmost) subsection 3308, and occupy all of the pins in the first and third columns and two adjacent pin pairs at the bottom of the second row. The signal allocations G and H are assigned to the fourth (rightmost) subsection 3308, and occupy all of the pins in the first and third columns and two adjacent pin pairs at the top of the second row. By this configuration, the first and fourth subsections 3308 have conjugate configurations, in that they have the same pin allocations rotated 180 degrees relative to each other.

The remaining signal allocations C-F are assigned to the innermost subsections 3308. The signal allocations C and D occupy all but one of the pins in the first and third columns and three adjacent pin pairs of the second row. The signal allocations E and F also occupy all but one of the pins in the first and third columns and three adjacent pin pairs of the second column. The unused pins in the two innermost columns can be used for a common ground signal. By this configuration, the second and third subsections 3308 have conjugate configurations, in that they have the same pin allocations rotated 180 degrees relative to each other.

The allocation of signals in the above pin configurations maintains the desired grouping of the incoming signal groups in substantially diagonal configurations. On the footprint side, the pin pairs used in the second columns of the subsections 2708 are substantially about a diagonal. Similarly, the pin organization at the header 2702 provides a zigzag pattern for each signal group that substantially tracks, albeit not perfectly, a diagonal pathway. The grouping in the header 2702 thus maintains signal groupings within at most two columns (or two rows if engaging a mating connector).

The above configuration allows for each individual subsection 2708 to connect each individual plate 202 with 27 different pins, thus providing in this embodiment a maximum of 27 different coupled signal pathways. When 8-bit HyperTransport signals are used, 20 of those pins pairs can carry the two signals: 10 pin pairs for outgoing signals (transmission), and 10 pin pairs for incoming signals (receipt). Thus, through this connector 2700, one connected circuit board 102 can communicate bidirectionally with any other connected circuit board 102 (or itself, if that is the assigned pathway).

We now turn to the design and construction of the plates 202. The embodiment which follows herein is specific to circular plates 202 in the wedding cake configuration of FIG. 32B, and designed to carry 8-bit HyperTransport signals. However, the invention is not limited to the particular embodiment. Other configurations also could be used to the extent that the system is utilizing other signals, shapes or formats.

Figure 36:
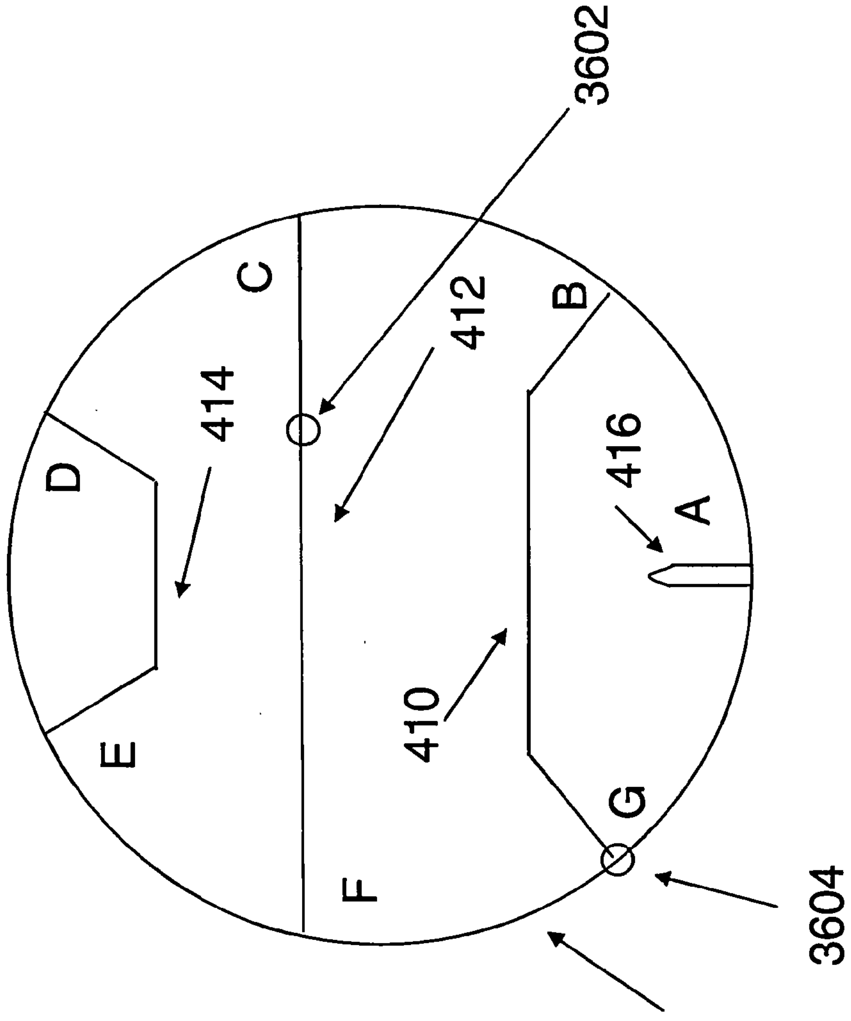
FIG. 36 is a top view of a plate with various portions identified for cross sections.

FIG. 36 shows the plate 202 previously discussed with respect to FIG. 4A. Two areas of interest are denoted by areas 3602 and 3604. Area 3602 highlights an interior portion of plate 202 through which a cross section is taken to examine the inner portions of plate 202 through which signals pass. Area 3604 highlights the edge portion of plate 202 that interfaces with connectors to communicate with the attached vertical circuit boards 102.

Figure 37:
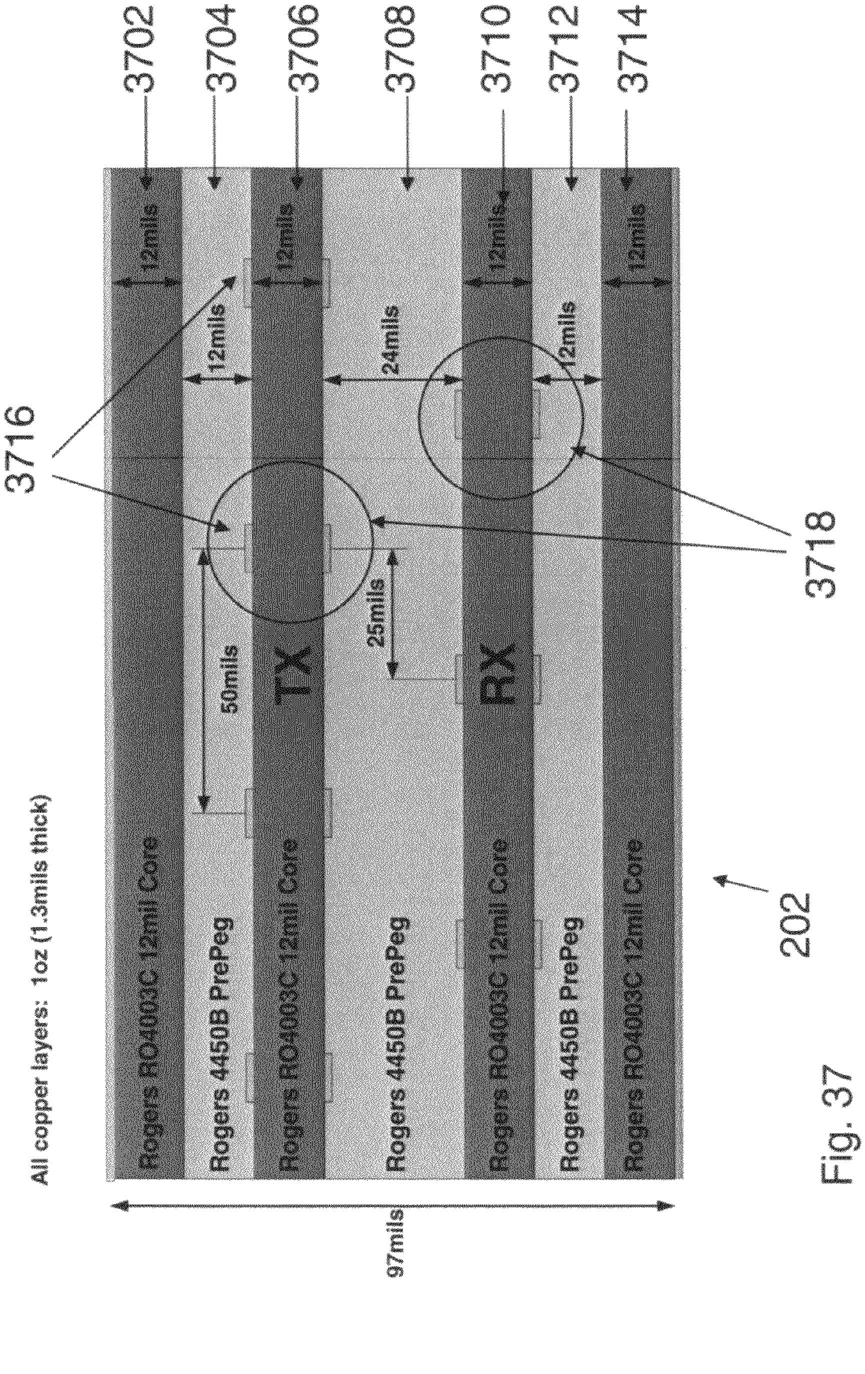
FIG. 37 is a cross section of a plate taken from an internal portion of a plate.

FIG. 37 shows a cross section of plate 202 in a cross section along signal pathway 412. Plate 202 includes a top layer of printed wiring board core material ("core") 3702, an upper layer of prepeg material 3704, an upper interior layer of core 3706, an interior layer of prepeg 3708, a lower interior layer of core 3710, a lower interior prepeg 3712, and a bottom layer of core 3714.

Current commercially available core material typically includes outer metal layers on both sides, typically ½ oz., 1 oz. or 2.0 oz. of electrodeposited copper, with known corresponding thickness, although the invention is not limited to these thicknesses. This metal can be etched to form various conductive paths on the core for transmission of signals, and this will be the case for metal layers inside plate 202. On the top and bottom of plate 202 in the portions away from the periphery (where the metal will be used to form connections with the connectors 1410), the metal can be removed, but is preferably left in place to physically reinforce plate 202. If left in place, it is preferably connected to a floating exterior ground to provide a degree of electrical isolation between adjacent plates 202. The interior facing sides of top and bottom core layers 3702 and 3714 may also leave the metal present for the same purpose of rigidity and grounding, but may also be removed. The embodiment of FIG. 37 shows core layers 3702 and 3714 with the outer metal present and the inner metal removed.

As discussed above, while communication pathway 412 was shown in various figures as a single line for simplicity, it preferably includes individual signal pathways. In the case of the instant embodiment, twenty (20) such single pathways are preferably provided for the two 8-bit HyperTransport signals via forty individual lines of (40) etched copper embedded into plate 202 (only a subset of the total single pathways being shown in FIG. 37). The metal is etched on core layers 3706 and 3710 to provide the conductive single pathways 3716 over which these signals pass between any two connected circuit boards 102 (or the same connected circuit board 102, if the pathway is one which connects a board to itself).

FIG. 37 shows an embodiment of a preferred but non-limiting configuration of conductive single pathways 3716 for transmission of the tightly coupled differential signals that comprise the 8-bit HyperTransport signals. The current standards for 8-bit HyperTransport signals require that the conductive pathways have an impendence of 100 ohms, which along with the thickness of the metal and the thickness of the core on which it resides will dictate the thickness of each conductive single pathway 3716. In FIG. 37, the use of core material 12 mils thick with 1 oz. copper dictates a width of approximately 9 mils for each conductive single pathway 3716. However, the conductive single pathways 3716 may be etched in any configuration, size or number as may be appropriate. Deviations from the optimal are permissible, although it may impact overall performance.

Figure 38:
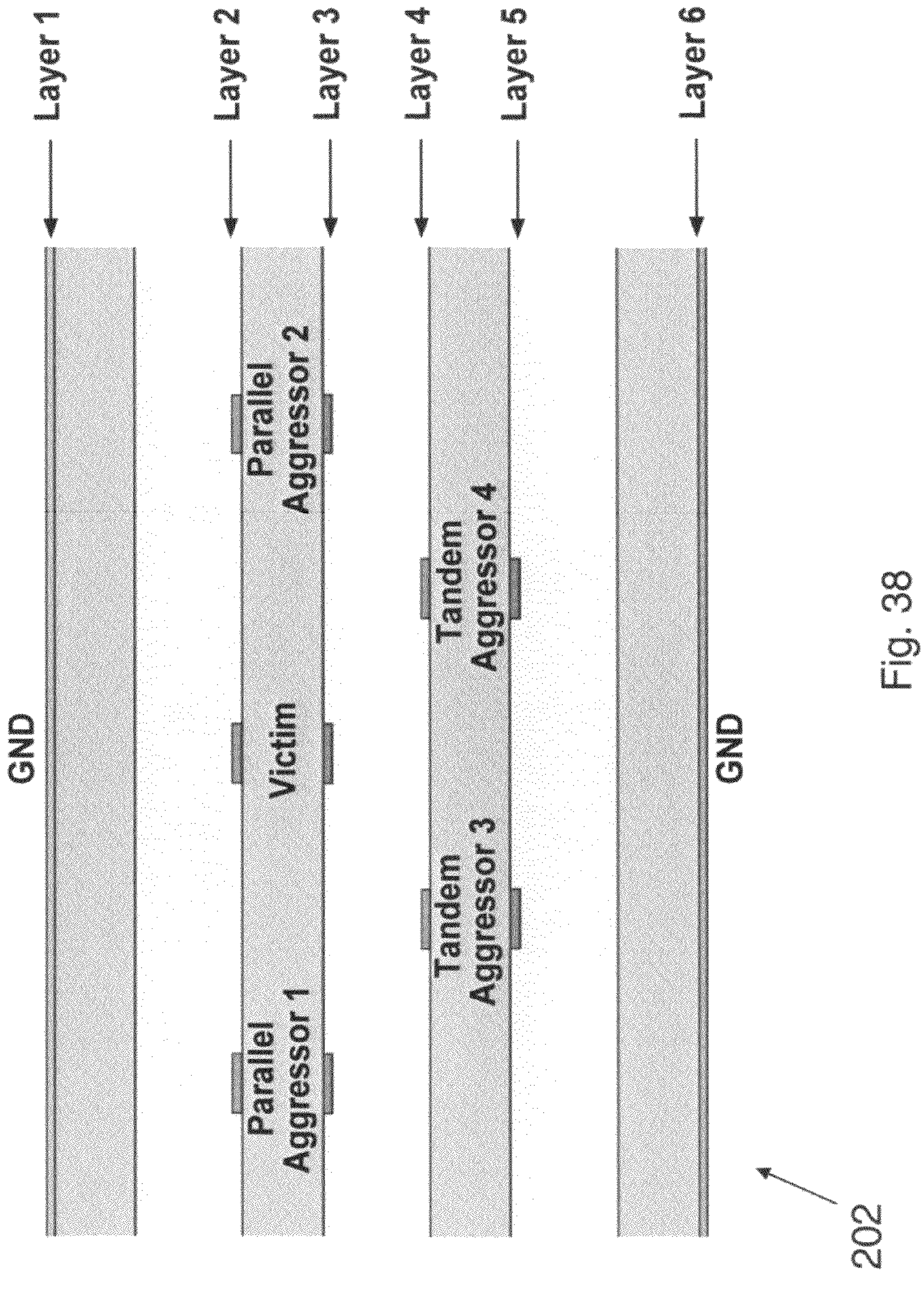
FIG. 38 illustrates the effect of neighboring aggressors on the individual copper pathways.

Tightly coupled differential signals are susceptible to cross talk from neighboring pin pairs. The embodiment of FIG. 37 includes various features to minimize the impact of such cross talk. Specifically, the two signal components of each tightly coupled differential signal are sent along a set 3718 of two conductive single pathways 3716. Each set 3718 has each conductive single pathway 3716 on opposite sides of the same core layer, and are in substantial axial alignment. Adjacent sets 3718 in the same core 3706 and 3710 are preferably equidistant from each other, particularly about 50 mils for the specific plate 202 in FIG. 37. Between the two interior core layers 3706 and 3710, the sets 3718 are preferably offset so that any one set 3718 on a core layer is equidistant from adjacent sets 3718 on the different core layer. As shown in FIG. 38, the use of this design effectively limits a particular differential pair (the "victim") to experience crosstalk from only 4 nearest neighbor aggressors (other pins being sufficiently far away that their crosstalk contribution is de minimus and considered zero for purposes of discussion herein).

Groups of tightly coupled differential signals that collectively form a larger overall signal, such as the components of an 8-bit HyperTransport signal, are preferably on the same core layer. Thus, by way of example, reference is made to the signals A and B of the common section 3308 that would connect (in a manner discussed below) to plate 202. Assume that the signal A pins are for transmitting an 8 bit-HyperTransport signal, and the signal B pins are for receiving an 8 bit-HyperTransport signal. All signal A pins would connect to upper interior care layer 3706, such that all transmission signals are confined to that core 3706 designated TX. Similarly, all signal B pins would connect to lower interior core layer 3710, such that all transmission signals are confined to that core 3710 designated RX.

The distribution of these signal groups on different core layers provides several advantages in cross talk reduction. For example, the individual sets 3718 are further away from each other than they would be if on the same core layer. The core layers can also be separated by additional thickness in the intervening prepeg layer 3708, such that increasing the size of prepeg layer 3708 further distances the two 8-bit HyperTransport signals from each other. That the two signal groups propagate in opposite directions (one being a transmission path, the other being a receiving path for a signal in the opposite direction) prevents four nearest neighbors from adding constructively along the length of line of the entire signal pathway along plate 202 between two circuit boards 102.

Figure 39:
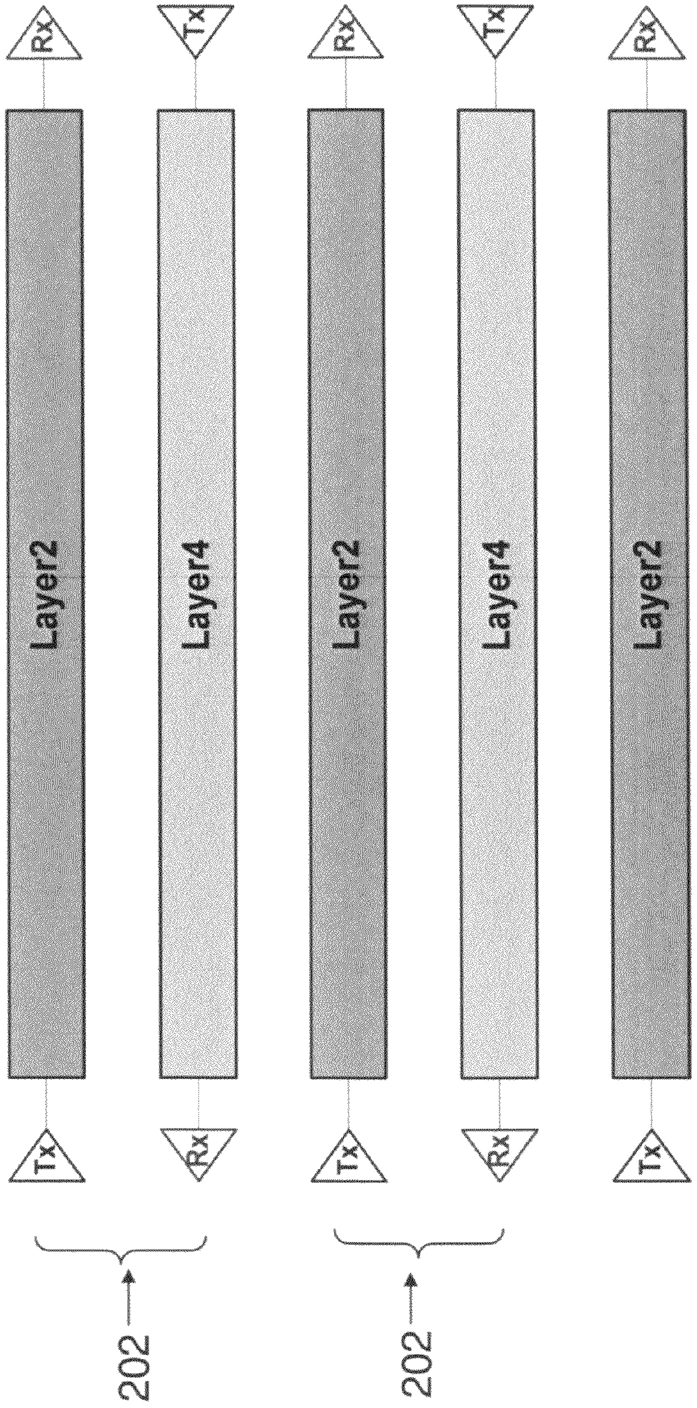
FIG. 39 illustrates the orientation of signal flow in stacked plates.

Further reduction in cross talk is achieved via this design when the plates 202 are stacked on each other, such as shown in FIGS. 2 and 32A. This principle is shown in FIG. 39, in which the direction of signal propagation is shown with respect to different core layers in adjacent plates 202. In each case, the left-to-right transmission pathways alternate along the axial height with right-to-left transmission pathways. Thus, the pathways that have a common direction are further apart then they would otherwise be, thus reducing crosstalk.

Uniformity of material is a priority for the transmission of tightly coupled differential signals, as it also suppresses crosstalk. Thus, core layers 3702, 3706, 3710 and 3714 are all preferably made from the same material and have dielectric constant within the range of 2.7-3.7. Prepeg layers 3704. 3708, and 3712 are all preferably made from the same material, and have a dielectric constant which is substantially identical to that of the core material of layers 3702, 3706, 3710 and 3714. The differential in dielectric constant between adjacent layers of core and prepeg is thus less than 0.05 in the preferred embodiment, preferably less than 0.02, and particularly less than 0.01. In addition, both the core and the prepeg preferably are higher performance circuit board materials with a loss tangent preferably less than about 0.006, and particularly less than 0.004. Differences on the high end of the noted spectrums or beyond will tend to degrade signal integrity, possibly forcing concessions in other design features, e.g., the diameter of plates 202.

Figure 41:
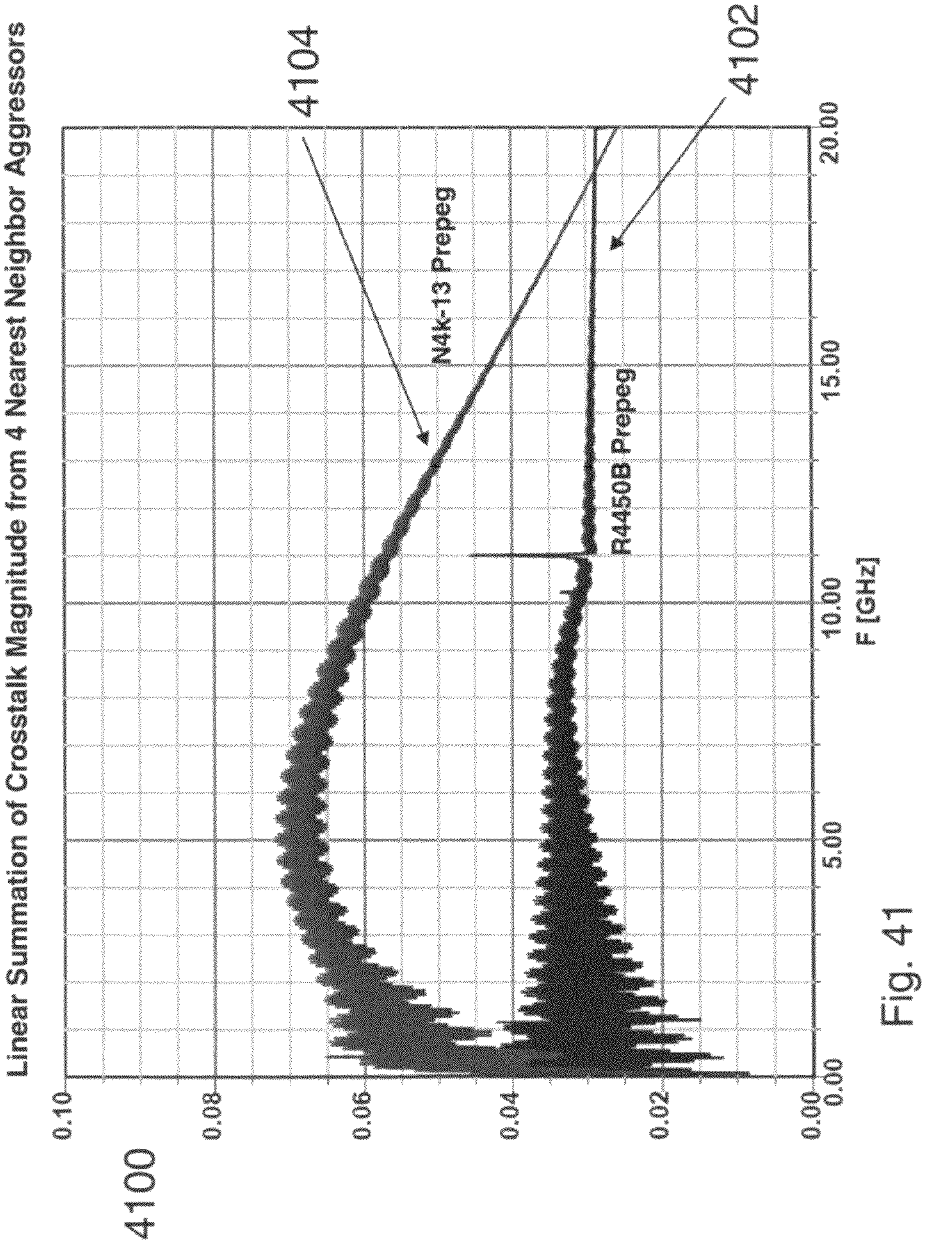
FIG. 41 is a graph of crosstalk magnitude.

ROGERS™ brand RO4003C is an example of an appropriate core material for layers 3702, 3706, 3710 and 3714, and ROGERS™ brand 4450B prepeg is an example of an appropriate prepeg material for layers 3704, 3708, and 3712. Other brand materials could also be used. FIG. 41 is a chart 4100 that shows how cross talk is related to the nature of the materials. Graph 4102 is the crosstalk resulting from the use of matched core and prepeg from ROGERS that deviate by about 0.01, and which have a loss tangent of about 0.004; the resulting cross talk is on the order of about 4%. In contrast, graph 4104 is the result of the use of a prepeg with a dielectric constant that deviates by 0.15 from the core material, and which has a loss tangent of about 0.0014; the resulting cross talk is about 7%.

Figure 42:
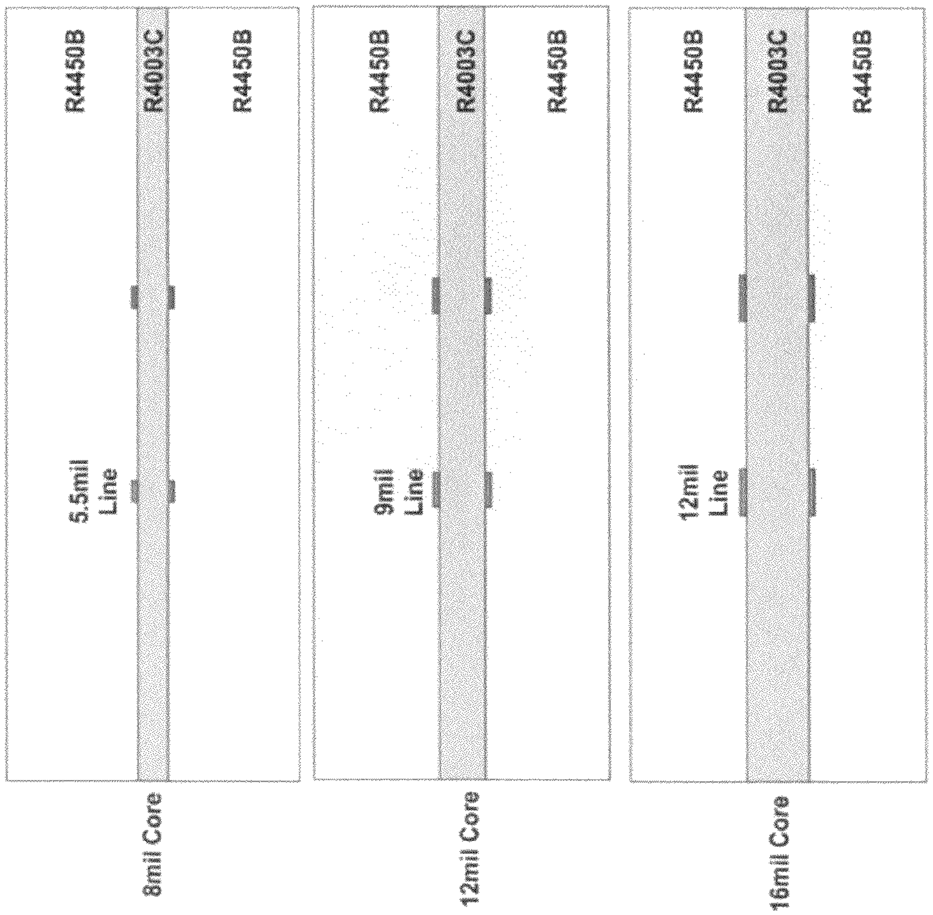
FIG. 42 shows the relationship between the thickness of core layers and copper pathways.

For manufacturing purposes, plate 202 is preferably on the order of 100 mils thick, with plate 202 in FIG. 37 being approximately 97 mils. Specific thickness of core and prepeg material is within the designer's discretion within the needs of the system. A limiting factor may be the thickness of commercially available core and prepeg materials, which are currently available in thicknesses including 8, 12 and 16 mils. Referring now to FIG. 42, since the copper pathways preferably have an impedance of approximately 100 ohms to carry the HyperTransport signals, the width of the copper pathways increases in relation to the thickness of the core to maintain that impedance value. Thus, for example, for boards having thickness of 8, 12 and 16 mils with 1 oz. copper, the widths of copper are preferably 5.5, 9 and 12 mils, respectively.

Other competing limiting values are the insertion loss and overall spacing required by the copper pathways. Minimizing the lateral space required by the pathways for the signals counsels in favor of the thinner pathways, and thus smaller boards; thus, the 8 mil core is more preferable to the 12 mil core, and both are more preferable than the 16 mil board. Insertion loss is a counter factor, as the insertion loss tends to be inversely related to the pathway width. By way of example, insertion loss is preferably less than −6 dB insertion loss at the frequency of the data rate (2.6 and 5.2 Gbps for the 8-bit HyperTransport signals), yet the insertion loss for 8 mil core 202 that is 39 inches in diameter is about −5.5 db, which consumes almost the entire −6 db leeway of the entire pathway. This may counsel in favor of thicker cores.

The impact of the above considerations are largely case specific. For the preferred embodiment herein, plate 202 could be made from alternating layers of core and prepeg at 16 mils thickness. However, cross talk between tightly coupled differential signals in core layers 3706 and 3710 can be further reduced by maximizing the distance between those layers with a thicker intermediate prepeg layer 3708. The embodiment of FIG. 37 thus utilizes 12 mil blocks of material for all core and prepeg layers, except for prepeg layer 3708 which is made of two 12 mil commercial prepeg blocks to obtain a greater distance between the signal sets 3718. Applicants note that any of layers 3702-3714 can be made from one or more blocks of material, whether coupled, connected, joined, fused, or unconnected; in any case, the layers 3702-3714 are still each considered an individual layer, or individual prepeg or core, regardless of the number of blocks of material used to make the layer. Thus, for example prepeg 3708 is a single "layer" of plate 202, even though it may be made from one or more in this case two blocks of 12 mil) smaller blocks of prepeg material.

The diameter of the plates 202 may be any given value as needed or viable with available construction methods. A smaller diameter will tend to bring the attached circuit boards 102 closer toward each other, which can reduce the gap between them and minimize the effectiveness of the interleaved cooling components. A larger diameter can increase manufacturing difficulties because of costs and weight issues. For these reasons, Applicants prefer an approximately 39 inch diameter design for the maximum outer diameter of any plate 202. For the "wedding cake" configuration of FIG. 32A, the largest plate 202 would be approximately 39 inches in diameter, while each of the smaller plates would be about 800-1000 mils smaller than the immediately adjacent lower board. Preferably, the differences in diameter between adjacent plates 202 in the wedding cake configuration is the same and uniform about the circumference, but this need not be the case and the invention is not so limited.

Figure 40:
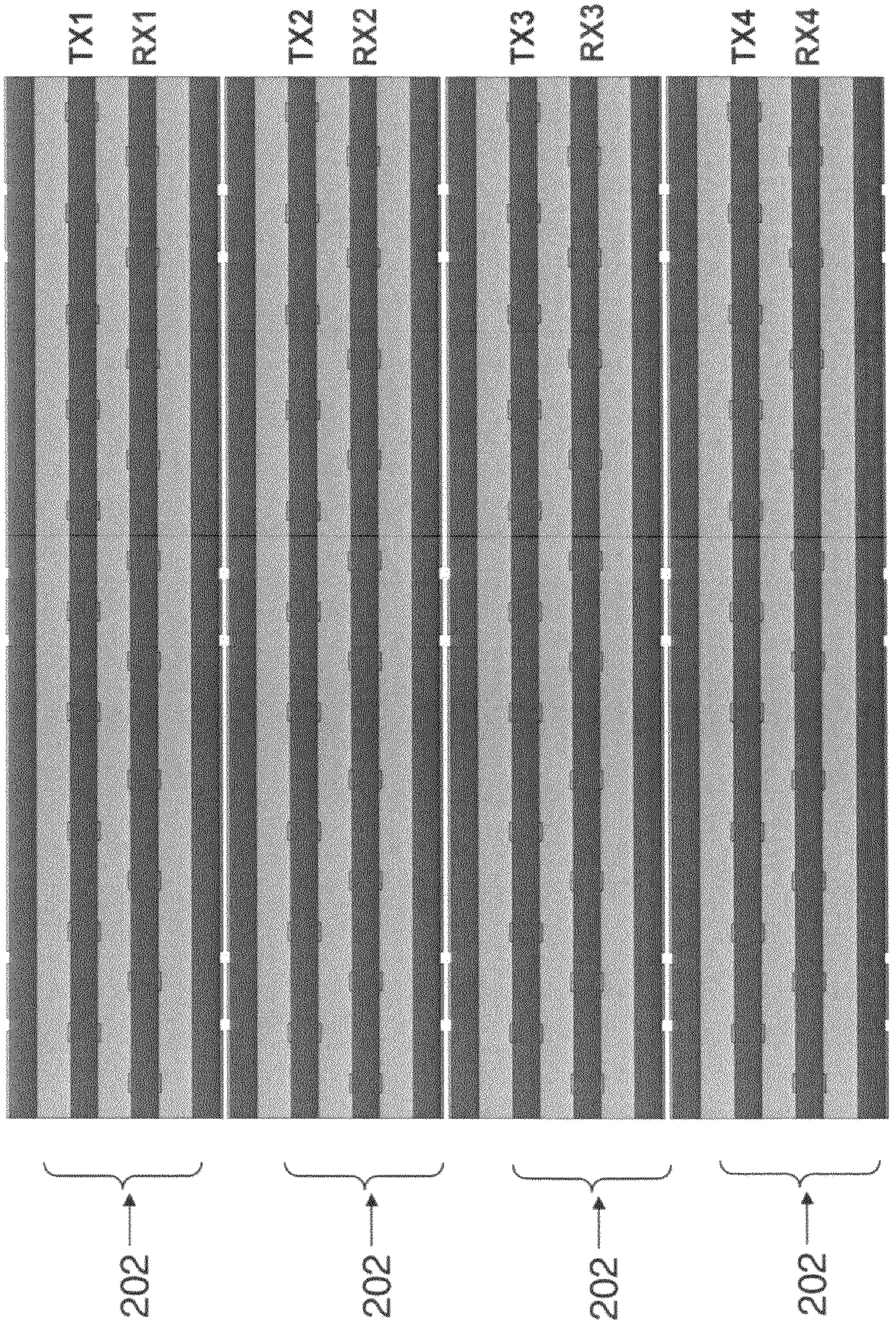
FIG. 40 is a cross section of several stacked plates at an interior portion thereof.

The above cross section of FIG. 37 only shows a portion of the sets 3718 that carry the 8-bit HyperTransport signals. FIG. 40 shows several plates 202 stacked in accordance with an embodiment of the invention, for which the cross section shows all of the ten (10) signal sets for each individual core layer. The air gap shown in FIG. 40 between adjacent plate 202 may be maintained by appropriate mechanical supports (not shown). In the alternative, the plates could lie directly on top of each other, without air gap there between.

The various copper pathways discussed above preferably extend across the interior of plate 202 from one end to the other. As shown, for example, in FIG. 36, the various pathways do not cross each other on a single plate. To minimize length of the copper pathways, the channels preferably extend through the interior of plate 202 in a straight line between the transmitting and receiving circuit boards 102.

Figure 43:
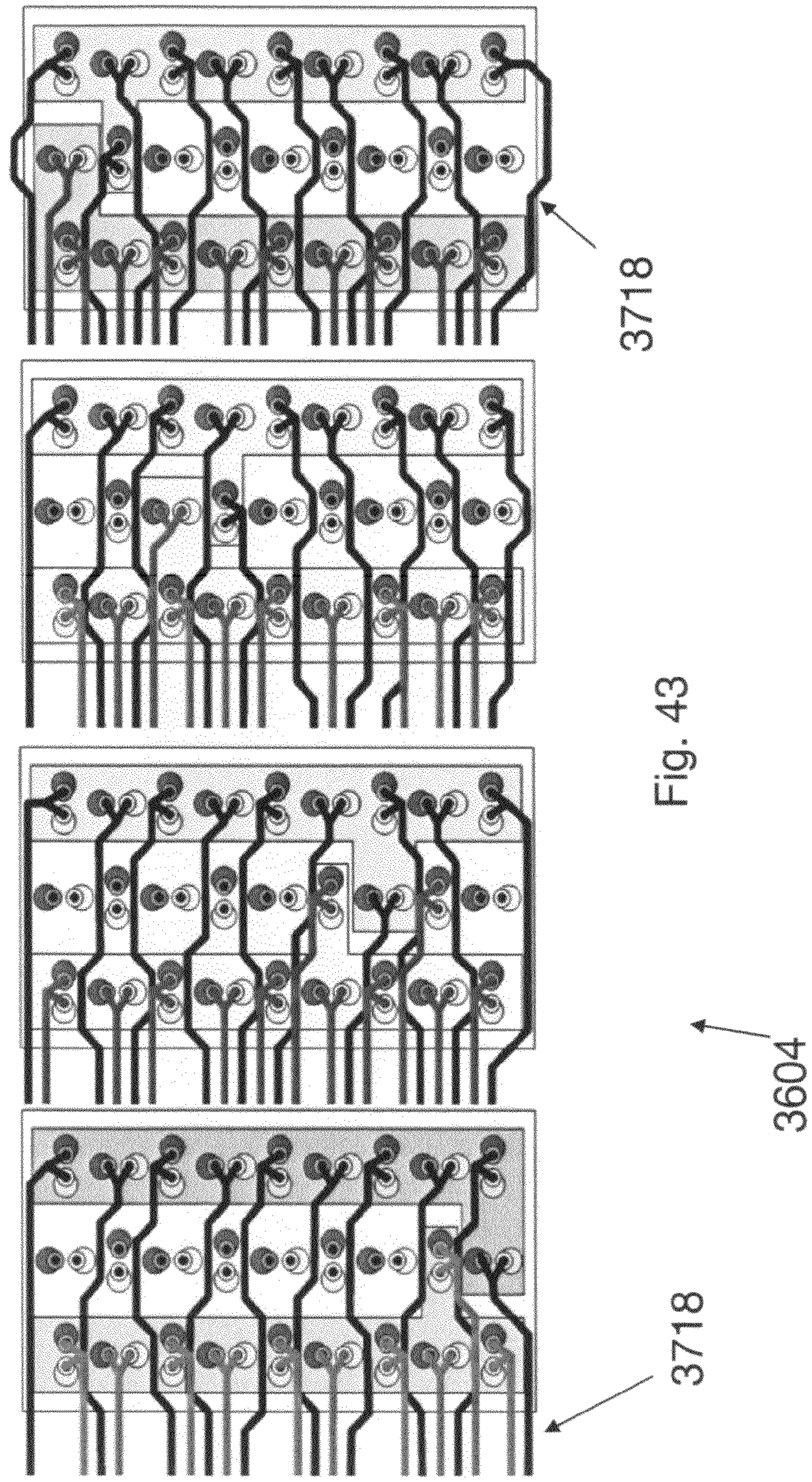
FIG. 43 is a top view of the layout of copper pathways in the periphery of the plates configured for connection to an external connector.

As the pathways reach their end points along the circumference of plates 202, the copper pathways diverge from the configuration of FIGS. 36 and 37 to align with the appropriate pin placement of connector 1410. FIG. 43 shows a non-limiting example of how the pathways connect can connect to various portions of the connector footprint.

Figure 45:
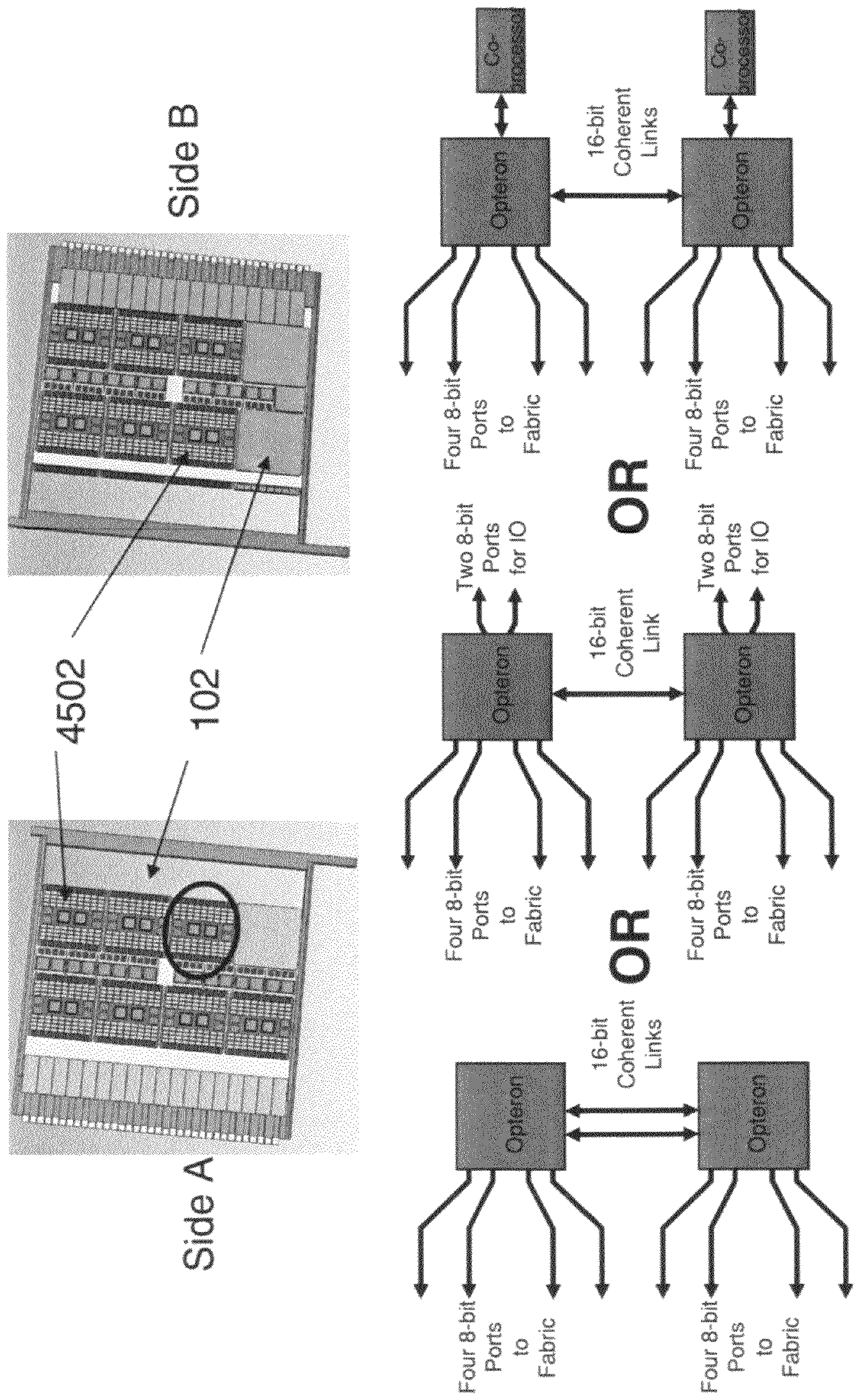
FIGS. 45 and 46 show features of a circuit board that can be connected to the embodiments of the invention.
Figure 46:
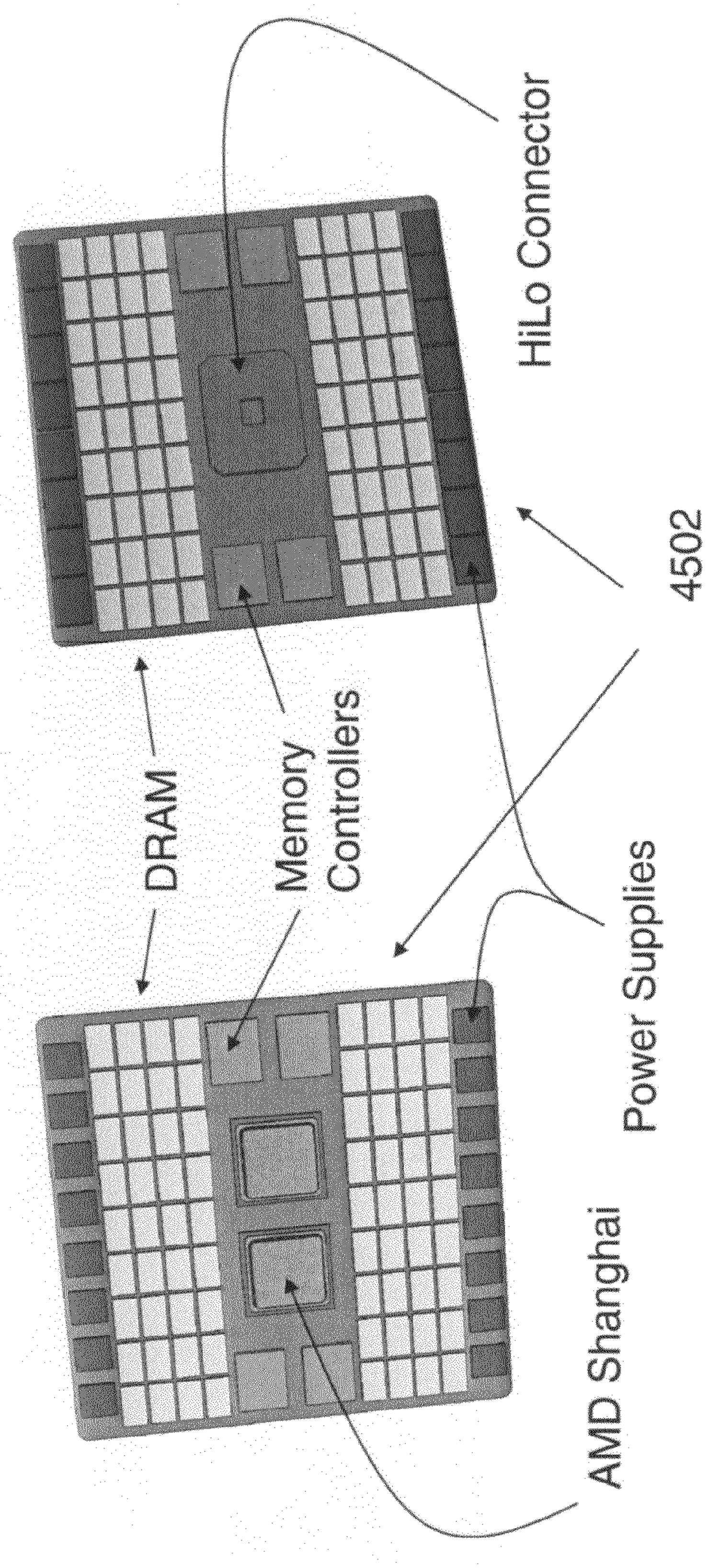

FIGS. 45 and 46 show additional information about the preferred configuration of vertical circuit boards 102. Boards 102 are preferably populated on both sides by processor modules 4502 that utilize OPTERON™ processors. However, the invention is not so limited, and any circuit boards 102 as appropriate may be used.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

For example, as discuss above, the plates 202 are preferably, but not necessarily, either identical or have identical layouts (e.g., in the tiered embodiment the plates may be different sizes but they have the same pathway design). This provides the convenience of using the same plates 202 for different layers of central hub 104. However, the individual plates 202 need not have such commonality, either in bulk or in groups. For example, all plates 202 could be custom designed and have no relation to any other. In the alternative, some plates may be of identical design while others are custom designed.

Plates 202 are preferred to be, but not necessarily, circular for symmetry. However, other shapes may be used, such as squares, rectangles, other multi-sided figures, ovals, etc. Based on the shape, the boards 202 may not be in ideal radial alignment, in that groups of boards may be parallel but at an angle to other groups of boards; e.g., if central hub 104 were a hexagon or octagon. As used herein, "substantially circular" includes any substantially symmetrical shape with more than five sides in its two dimensional cross section, and columns of connectors 204 and circuit boards 102 that extend from said structures are considered in substantially radial alignment with the substantially circular shape. Similarly, "circular" includes a perfectly circular shape, as well as any substantially symmetrical shape with so many sides that it periphery approximates a circle, e.g., a shape with more than twelve sides in its two dimensional cross section. Columns of connectors 204 and circuit boards 102 that extend from said structure are considered in radial alignment with the with the "circular" despite any minor angular deviation.

Each plate 202 may have cutouts, recess and the like. The individual plates need only provide the necessary pathways as discussed herein.

Each plate 202 preferably, but not necessarily, has a pathway that connects to itself, which lends itself (but does not require) an odd number of connectors 204. However, the invention is not so limited and such a pathway may be omitted. This would lend the configuration of plate 202 to have (but does not require) an even number of columns of connectors 204.

Heat sinks 110 are preferably, but not necessarily, web shaped to fit radially aligned circuit boards. However, other shapes may be used regardless of board orientation. Different board orientations may also suggest different shapes appropriate to fill the gap there between.

The embodiments herein have been directed on plates of core and prepeg that support copper pathways. However, the invention is not so limited. Other materials, known or as may be invented, could be used as the transmission components of hub 104. By way of example, fiber optics, physically supported or embedded in an appropriate medium, could be used. Similarly, not every layer of core and prepeg is necessary; for example, core 3702 and 3714 could be removed and/or replaced, such as with metal.

What is claimed is:

1. A heat sink for exchanging heat with an object, comprising:

a hollow sealed enclosure, at least a portion of said hollow sealed enclosure being thermally conductive;

at least one fluid inlet tube connected to said sealed enclosure, and configured to deliver fluid to said sealed enclosure;

at least one fluid outlet tube connected to said sealed enclosure, and configured to remove fluid from said sealed enclosure;

a return tube configured to receive fluid from at least said at least one outlet tube for return to a source of fluid;

said hollow sealed enclosure being configured to expand under positive pressure within said enclosure and contract under negative pressure within said enclosure;

wherein when fluid is injected at above a minimum pressure into said hollow sealed enclosure, said enclosure will fill and then expand;

wherein when said fluid is withdrawn from said hollow sealed enclosure, said enclosure will contract; and wherein said return tube extends through an interior of said enclosure.

2. the heat sink of claim 1, further comprising:

said at least one inlet tube being connected to a first end of said enclosure;

said at least one outlet tube being connected to a second end of said enclosure; and wherein said at least one inlet tube, said enclosure, and said at least one outlet tube define a first fluid path for fluid through said enclosure, and wherein said return tube provides a second fluid path through said enclosure distinct from said first fluid path, such that said first and second fluid paths do not overlap.

3. The heat sink of claim 1, wherein:

when said hollow sealed enclosure is expanded said object will be in contact with said enclosure such that heat from the object can transfer into the fluid within the enclosure through said thermally conductive portion; and when said hollow sealed enclosure is contracted said object will be separated from said enclosure by at least an air gap.

4. The heat sink of claim 3, wherein contact between said object and said enclosure occurs over a portion of said enclosure that is thermally conductive, such that heat energy will readily transmit through said enclosure between said object and fluid within said enclosure.

5. The heat sink of claim 1, wherein said enclosure has a rectangular cross section taken along an axis of said enclosure.

6. The heat sink of claim 1, wherein said enclosure has a substantially wedge shaped cross section taken along an axis of said enclosure.

7. The heat sink of claim 1, wherein said enclosure has a substantially wedge shape.

8. The heat sink of claim 1, wherein said at least one inlet tube is connected to a first end of said enclosure, and said at least one outlet tube is connected to a second end of said enclosure.

9. A heat sink for exchanging heat with an object, comprising:

a wedge-shaped hollow sealed enclosure, said hollow sealed enclosure having a first side that is thermally conductive and semi-rigid, such that heat will readily transmit through said first side;

at least one fluid inlet tube connected to said sealed enclosure, and configured to deliver fluid to said sealed enclosure;

at least one fluid outlet tube connected to said sealed enclosure, and configured to remove fluid from said sealed enclosure;

a return tube configured to receive fluid from at least said at least one outlet tube for return to a source of fluid;

said hollow sealed enclosure being configured to expand under positive pressure within said enclosure and contract under negative pressure within said enclosure;

wherein when fluid is injected into said hollow sealed enclosure, said enclosure will fill and then expand;

wherein when said fluid is withdrawn from said hollow sealed enclosure, said enclosure will contract; and wherein said return tube extends through an interior of said enclosure.

10. The heat sink of claim 9, wherein:

when said hollow sealed enclosure is expanded said object will be in contact with said first side such that heat from the object can transfer into the fluid within the enclosure through said thermally conductive portion; and when said hollow sealed enclosure is contracted said object will be separated from said first side by at least an air gap.

11. The heat sink of claim 10, wherein contact between said object and said first side allows heat to flow between the said object and fluid within said enclosure through the first side.

12. The heat sink of claim 9, wherein said enclosure has a rectangular cross section taken along an axis of said enclosure.

13. The heat sink of claim 9, wherein said at least one inlet tube is connected to a first end of said enclosure, and said at least one outlet tube is connected to a second end of said enclosure.

14. The heat sink of claim 9, further comprising:

said at least one inlet tube being connected to a first end of said enclosure;

said at least one outlet tube being connected to a second end of said enclosure; and wherein said at least one inlet tube, said enclosure, and said at least one outlet tube define a first fluid path for fluid through said enclosure, and wherein said return tube provides a second fluid path through said enclosure distinct from said first fluid path, such that said first and second fluid paths do not overlap.

15. A heat sink for exchanging heat with adjacent objects, comprising:

first and second adjacent objects defining a gap there between;

a hollow sealed enclosure mounted in the gap, said hollow sealed enclosure having first and second sides that are thermally conductive and semi-rigid, such that heat will readily transmit through said first and second sides;

at least one fluid inlet tube connected to said sealed enclosure, and configured to deliver fluid to said sealed enclosure;

at least one fluid outlet tube connected to said sealed enclosure, and configured to remove fluid from said sealed enclosure;

a return tube that extends through an interior of said enclosure and is configured to receive fluid from at least said at least one outlet tube for return to a source of fluid;

said hollow sealed enclosure being configured to expand under positive pressure within said enclosure and contract under negative pressure within said enclosure;

wherein when fluid is injected into said hollow sealed enclosure, said enclosure will fill and then expand such that first side contacts said first object and said second side contacts said second object, such that heat can flow between the first and second object and the fluid within said enclosure; and wherein when said fluid is withdrawn from said hollow sealed enclosure, said enclosure will contract such that said first side is separated from the first object by at least an air gap, and said second side is separated from the first object by at least an air gap.

16. The heat sink of claim 15, further comprising:

said at least one inlet tube being connected to a first end of said enclosure;

said at least one outlet tube being connected to a second end of said enclosure; and wherein said at least one inlet tube, said enclosure, and said at least one outlet tube define a first fluid path for fluid through said enclosure, and wherein said return tube provides a second fluid path through said enclosure distinct from said first fluid path, such that said first and second fluid paths do not overlap.

17. The heat sink of claim 16, wherein said enclosure has a rectangular cross section taken along an axis of said enclosure.

18. The heat sink of claim 16, wherein said enclosure has a substantially wedge shaped cross section taken along an axis of said enclosure.

19. The heat sink of claim 1, wherein said at least a portion of said hollow sealed enclosure is made of metal.

20. The heat sink of claim 19, wherein said metal is semi-rigid stainless steel.

21. The heat sink of claim 9, wherein said first side is made of metal.

22. The heat sink of claim 21, wherein said metal is semi-rigid stainless steel.

23. The heat sink of claim 15, wherein said first and second sides are made of metal.

24. The heat sink of claim 23, wherein said metal is semi-rigid stainless steel.

* * * * *